(12) United States Patent
Bonkohara

(10) Patent No.: US 8,300,143 B2
(45) Date of Patent: Oct. 30, 2012

(54) SOLID-STATE IMAGING DEVICE, METHOD OF FABRICATING THE SAME, AND CAMERA MODULE

(76) Inventor: Manabu Bonkohara, Tokyo (JP)

( * ) Notice: Subject to any disclaimer, the term of this patent is extended or adjusted under 35 U.S.C. 154(b) by 18 days.

(21) Appl. No.: 12/521,690

(22) PCT Filed: Dec. 29, 2007

(86) PCT No.: PCT/JP2007/075332
§ 371 (c)(1),
(2), (4) Date: Feb. 10, 2011

(87) PCT Pub. No.: WO2008/081950
PCT Pub. Date: Jul. 10, 2008

(65) Prior Publication Data
US 2011/0122303 A1 May 26, 2011

(30) Foreign Application Priority Data
Dec. 29, 2006 (JP) .................................. 2006-356931

(51) Int. Cl.
*H04N 5/225* (2006.01)
(52) U.S. Cl. ........................................ 348/373; 348/376
(58) Field of Classification Search .......... 348/373–376; 250/239; 257/433
See application file for complete search history.

(56) References Cited

U.S. PATENT DOCUMENTS

| | | | |
|---|---|---|---|
| 7,616,250 | B2 | 11/2009 | Watanabe et al. |
| 2005/0285215 | A1* | 12/2005 | Lee et al. ................. 257/432 |
| 2006/0023108 | A1* | 2/2006 | Watanabe et al. .......... 348/335 |
| 2006/0202223 | A1* | 9/2006 | Sackrison et al. ............. 257/99 |
| 2007/0019101 | A1* | 1/2007 | Minamio et al. ............. 348/335 |
| 2007/0126914 | A1 | 6/2007 | Komatsu et al. |

FOREIGN PATENT DOCUMENTS

| | | |
|---|---|---|
| JP | 2001-274370 | 10/2001 |
| JP | 2004-37810 A | 2/2004 |
| JP | 2004-140497 | 5/2004 |
| JP | 2005-109092 | 4/2005 |
| JP | 2006-41183 A | 2/2006 |
| JP | 2006-41277 A | 2/2006 |
| JP | 2007-140497 | 6/2007 |
| JP | 2007-142194 A | 8/2007 |

OTHER PUBLICATIONS

International Search Report issued in corresponding application No. PCT/JP2007/075332, completed Mar. 31, 2008 and mailed Apr. 8, 2008.

* cited by examiner

*Primary Examiner* — Lin Ye
*Assistant Examiner* — Euel Cowan
(74) *Attorney, Agent, or Firm* — Griffin & Szipl, P.C.

(57) ABSTRACT

Image quality degradation due to external light irradiated to an edge section of a transparent cover of a solid-state imaging device and external light propagating in the cover is prevented with a simple structure.
A glass cover 60 formed to cover the whole surface of an imaging region 26 of a solid-state imaging element 10 is constituted by a transmission section 60a corresponding to the imaging region 26, and an edge section 60b that surrounds the transmission section 60a outside the transmission section 60a. The edge section 60b of the cover 60 is selectively removed around a periphery of the edge section 60b, thereby forming a frustum-shaped part whose cross-sectional area decreases monotonously from its exit side to its incidence side in the cover 60. An optical function film 63 having an optical absorption, reflection, or scattering action is formed on an outer face of the frustum-shaped part.

28 Claims, 32 Drawing Sheets

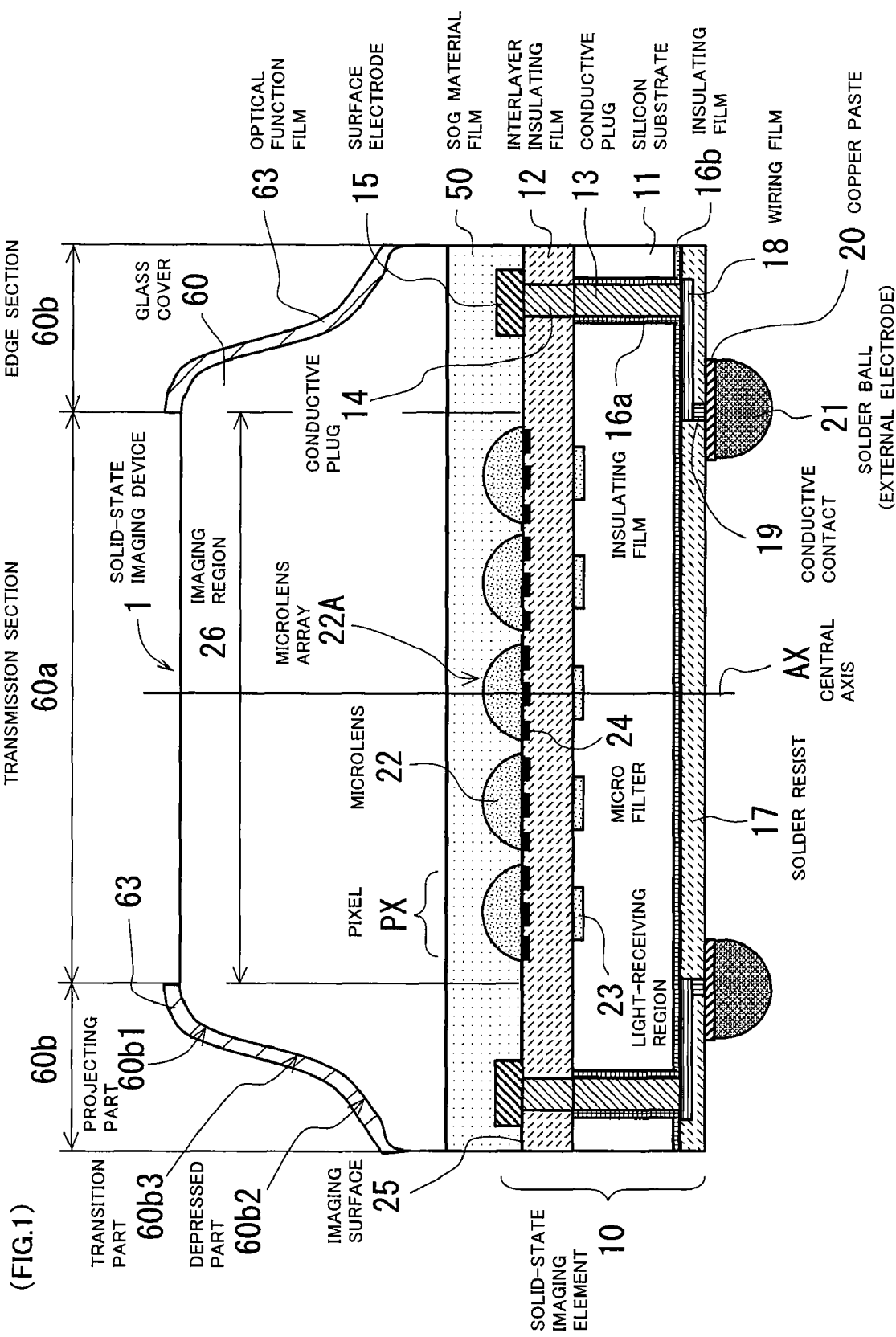

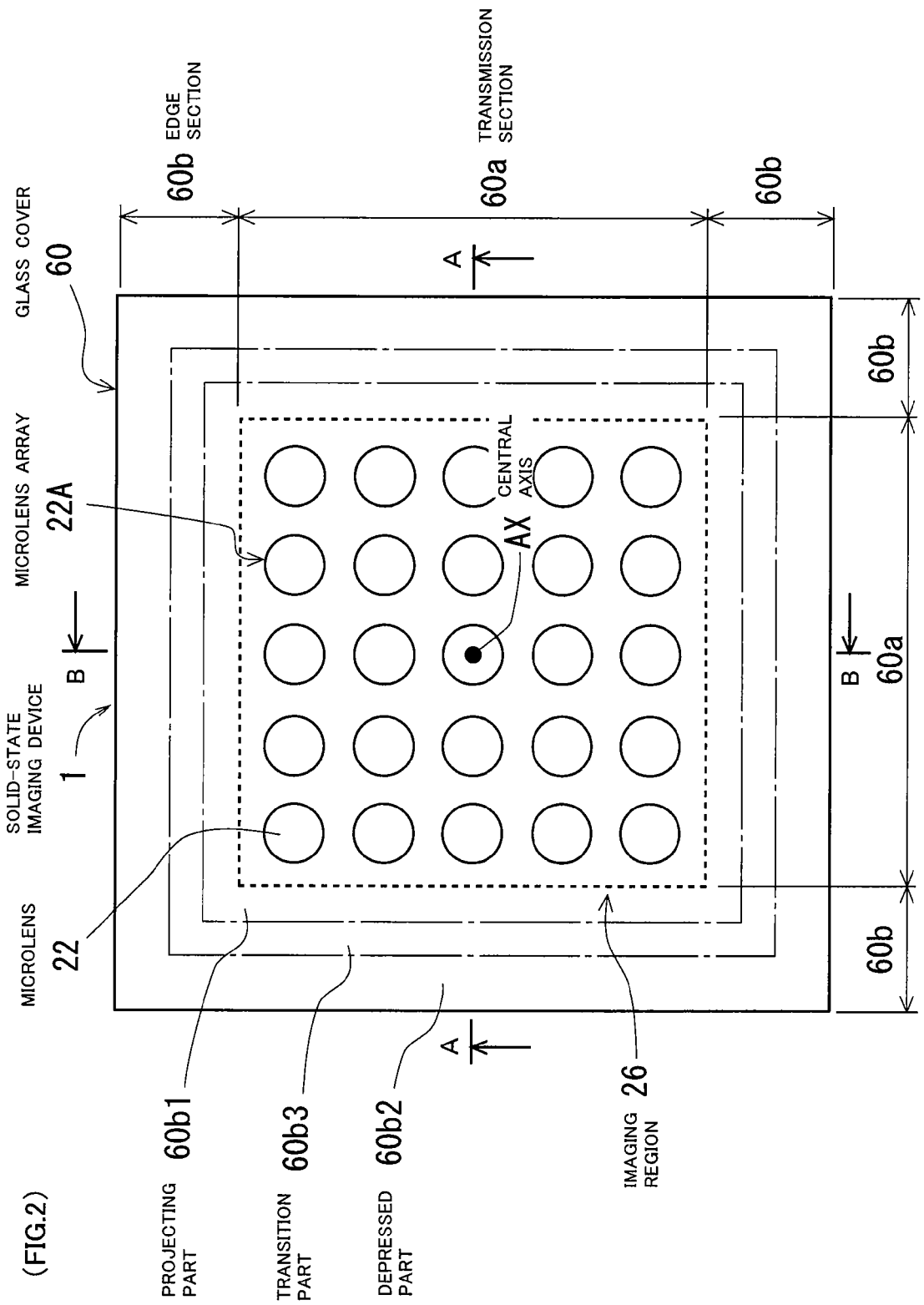

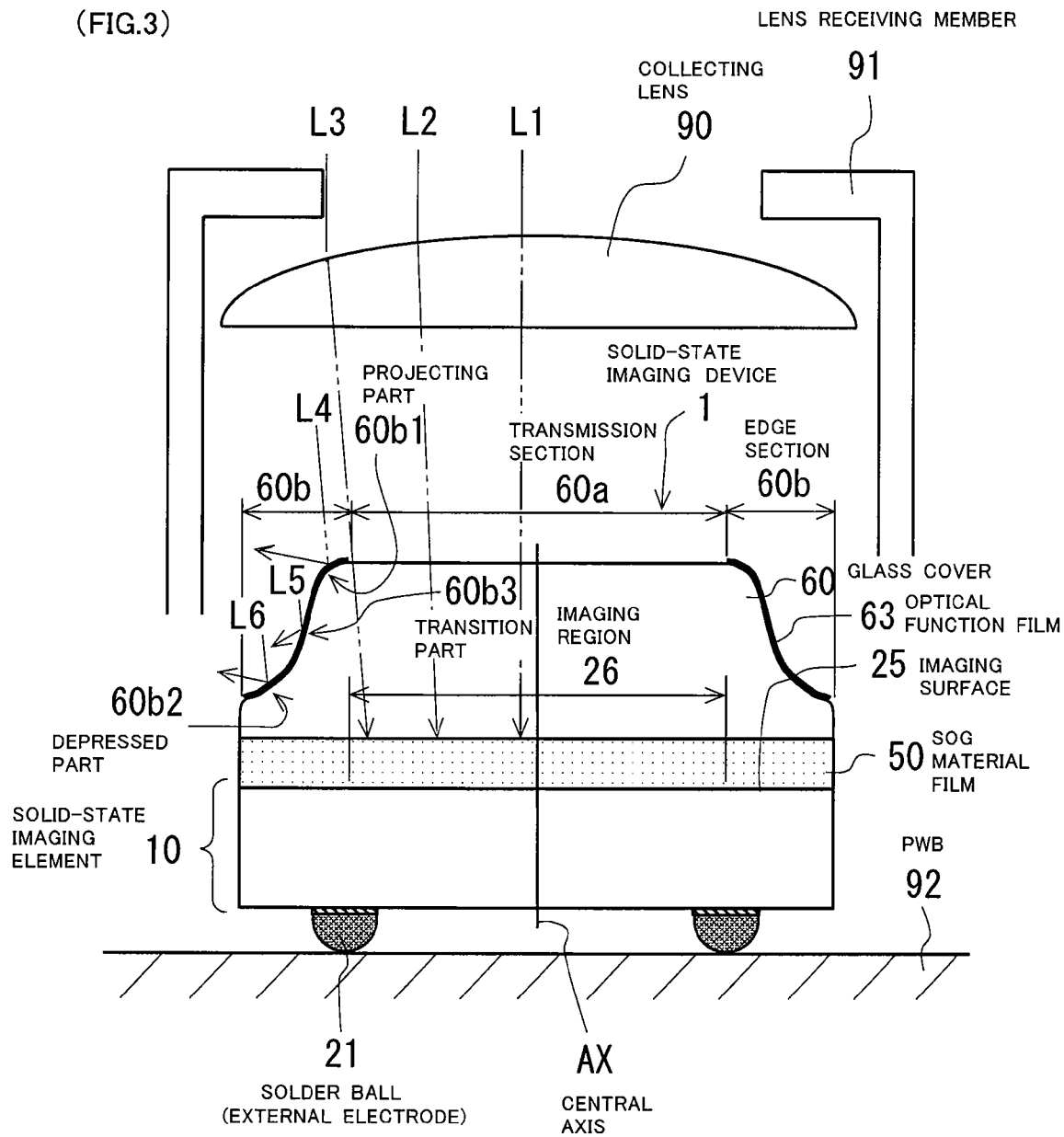
(FIG.3)

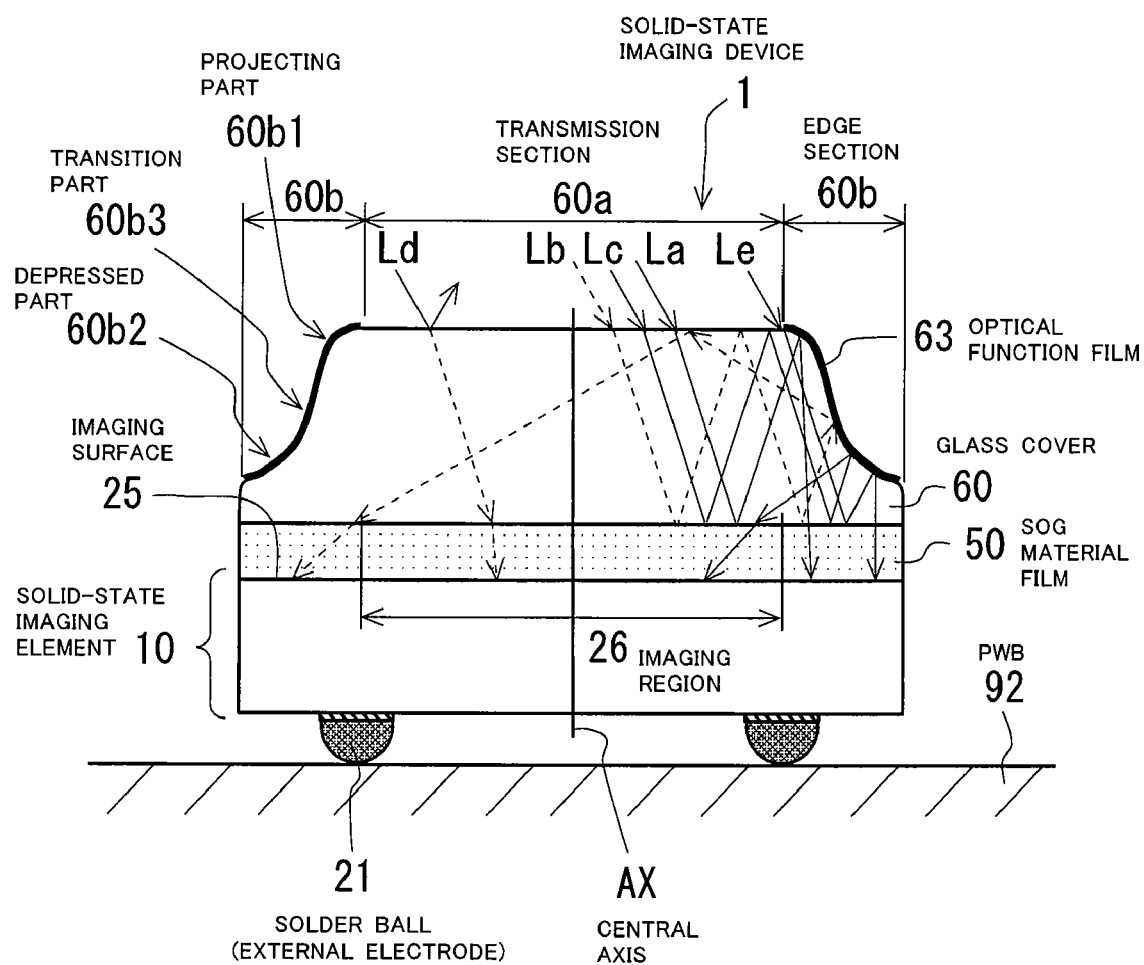
(FIG.4)

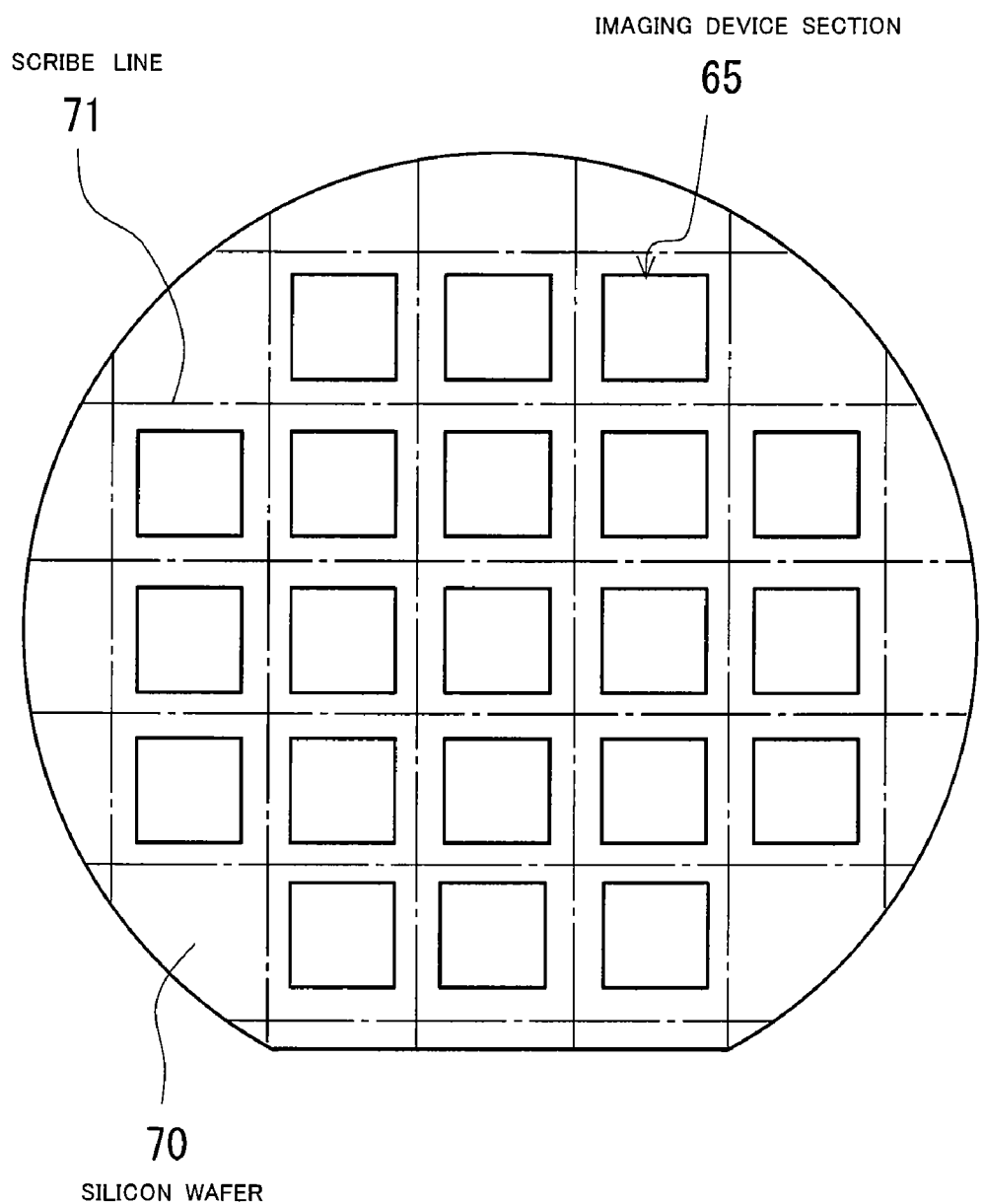

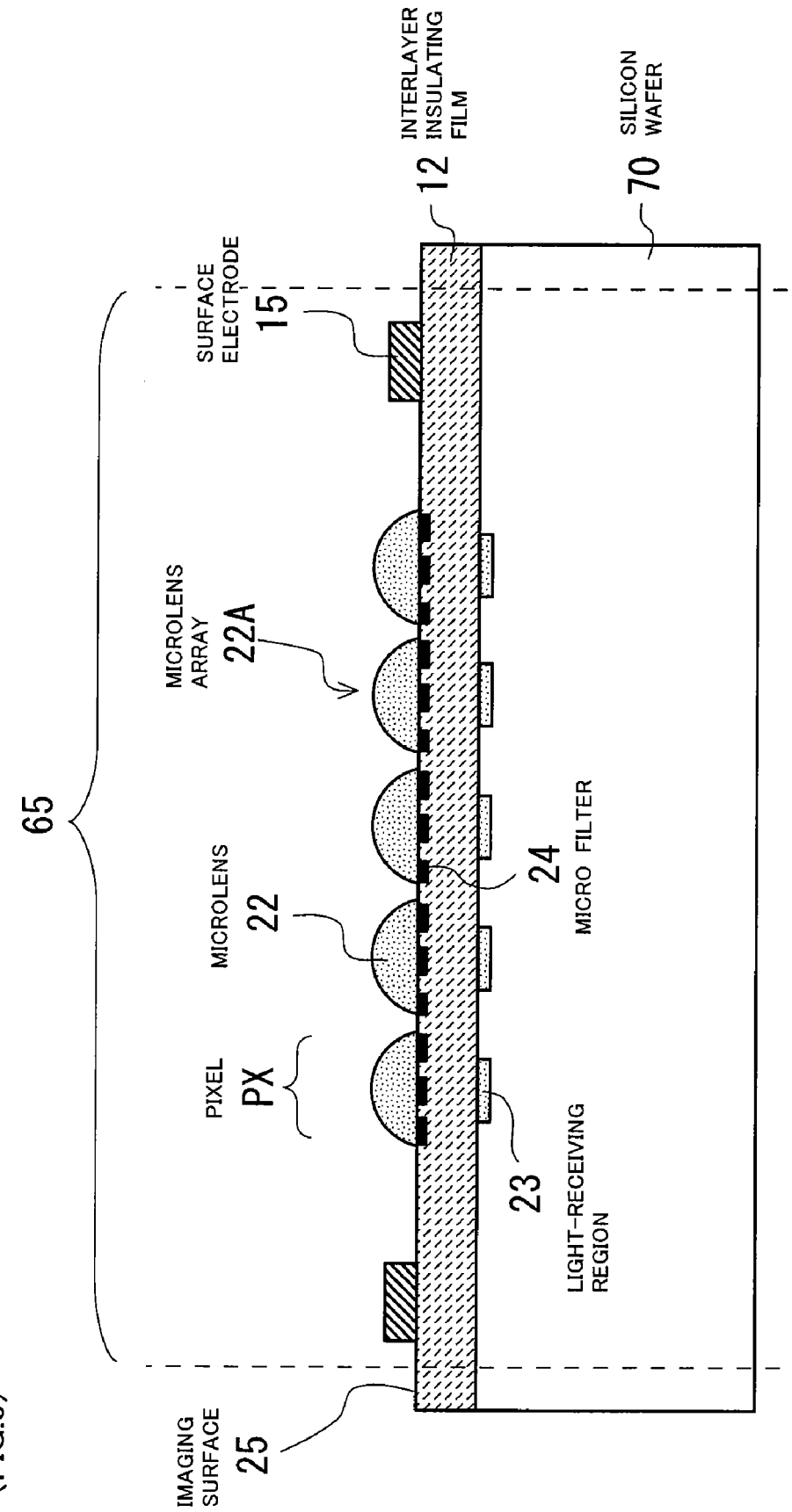

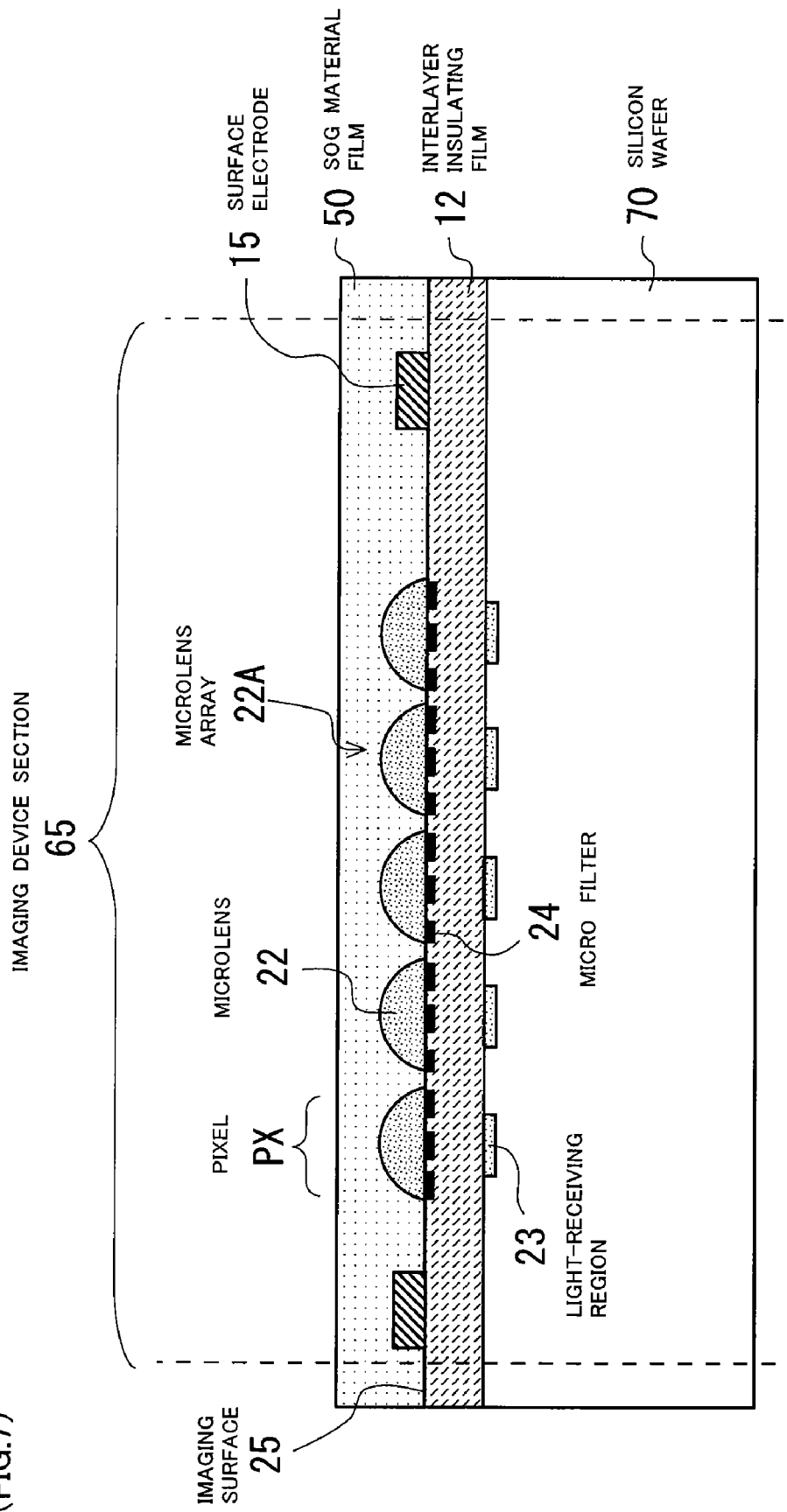

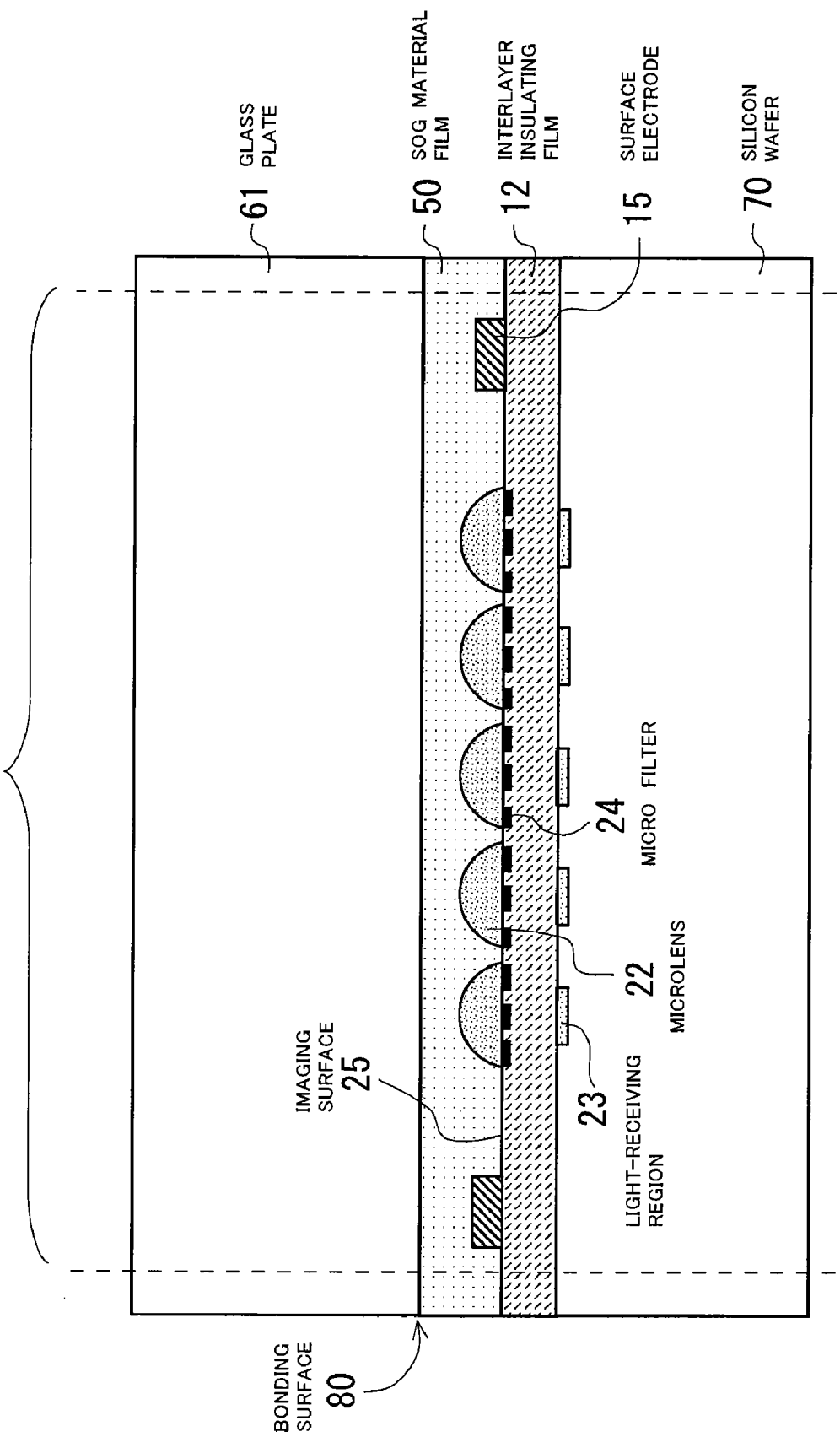

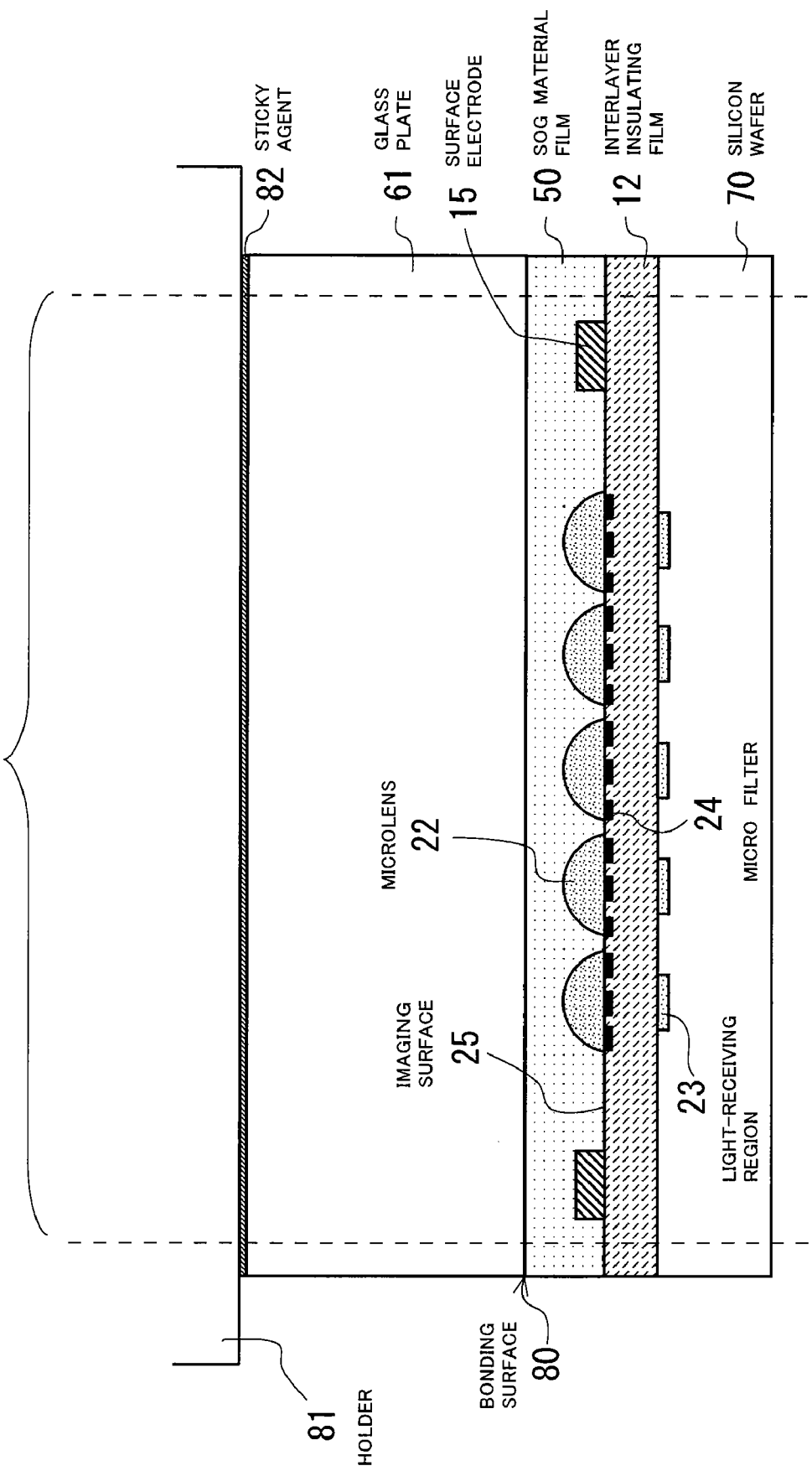

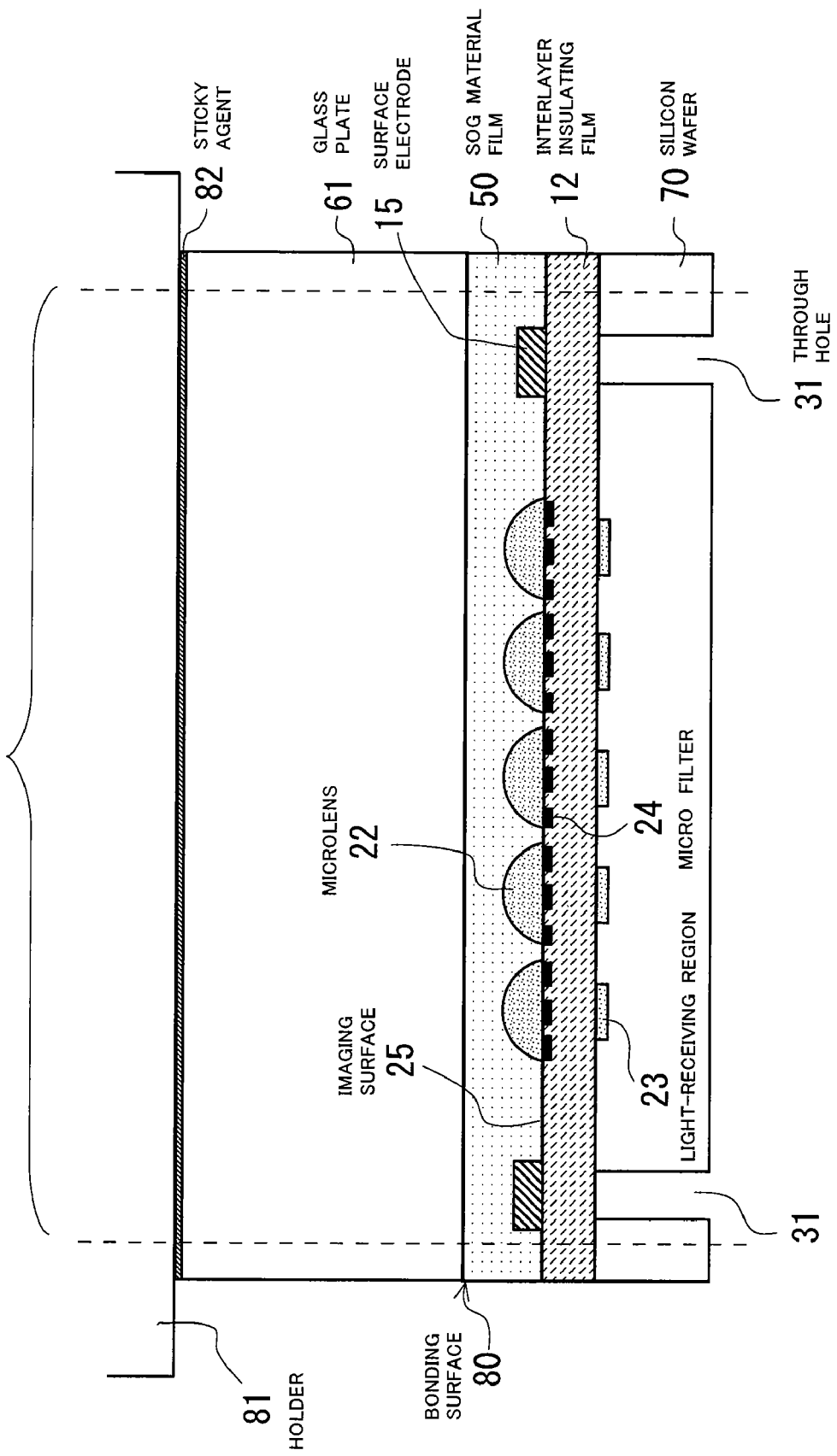
(FIG.10)

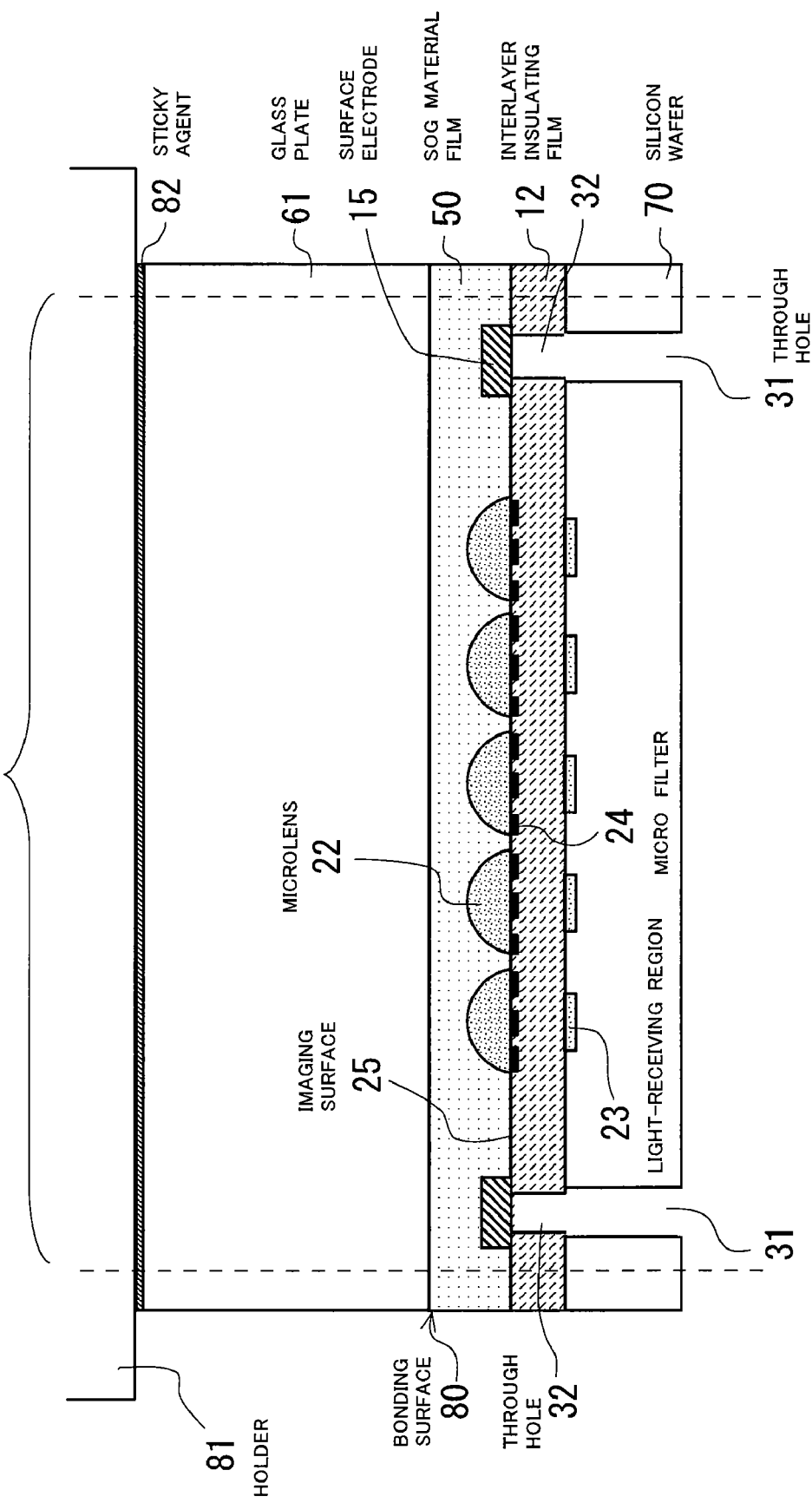

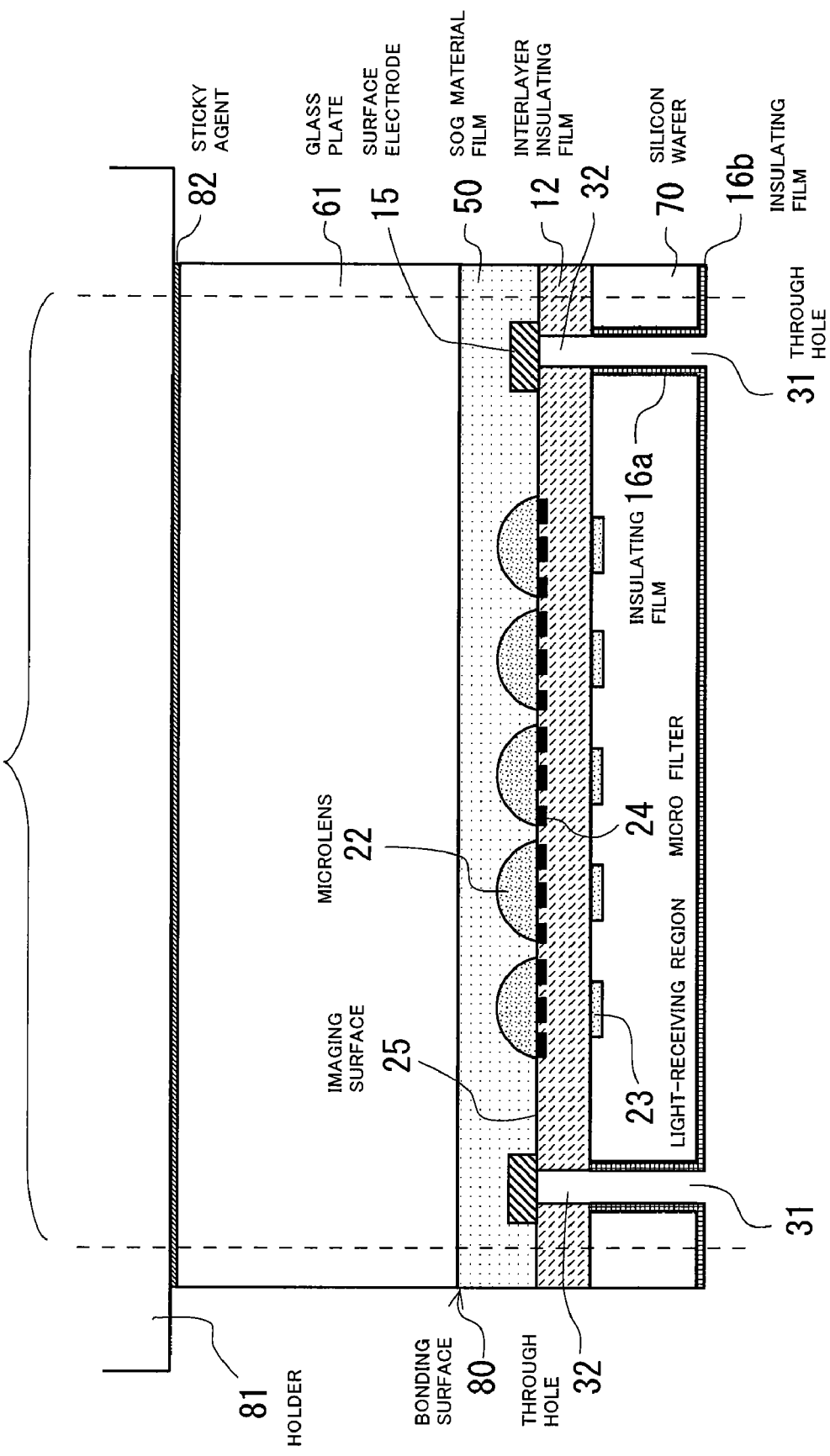
(FIG.12)

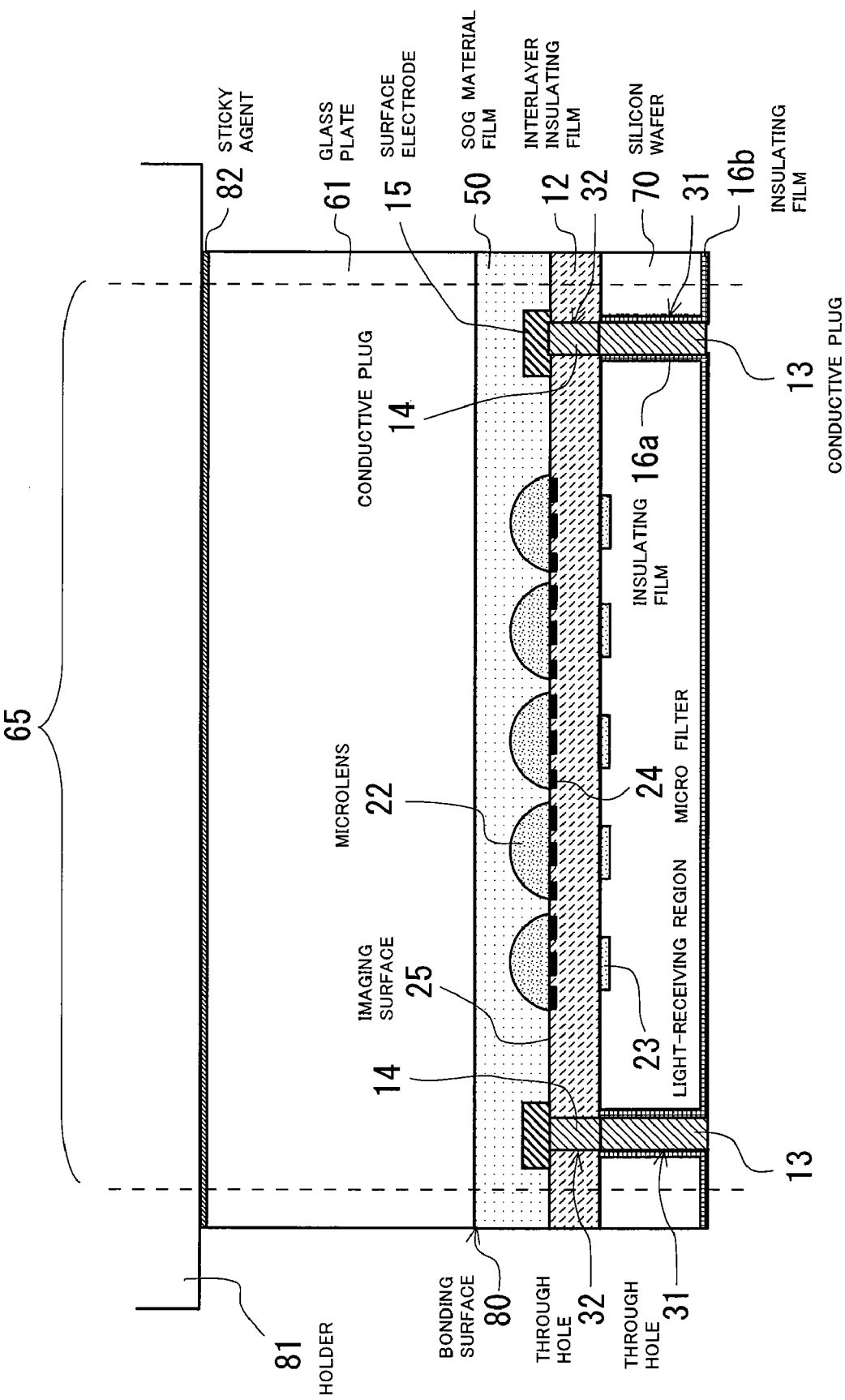

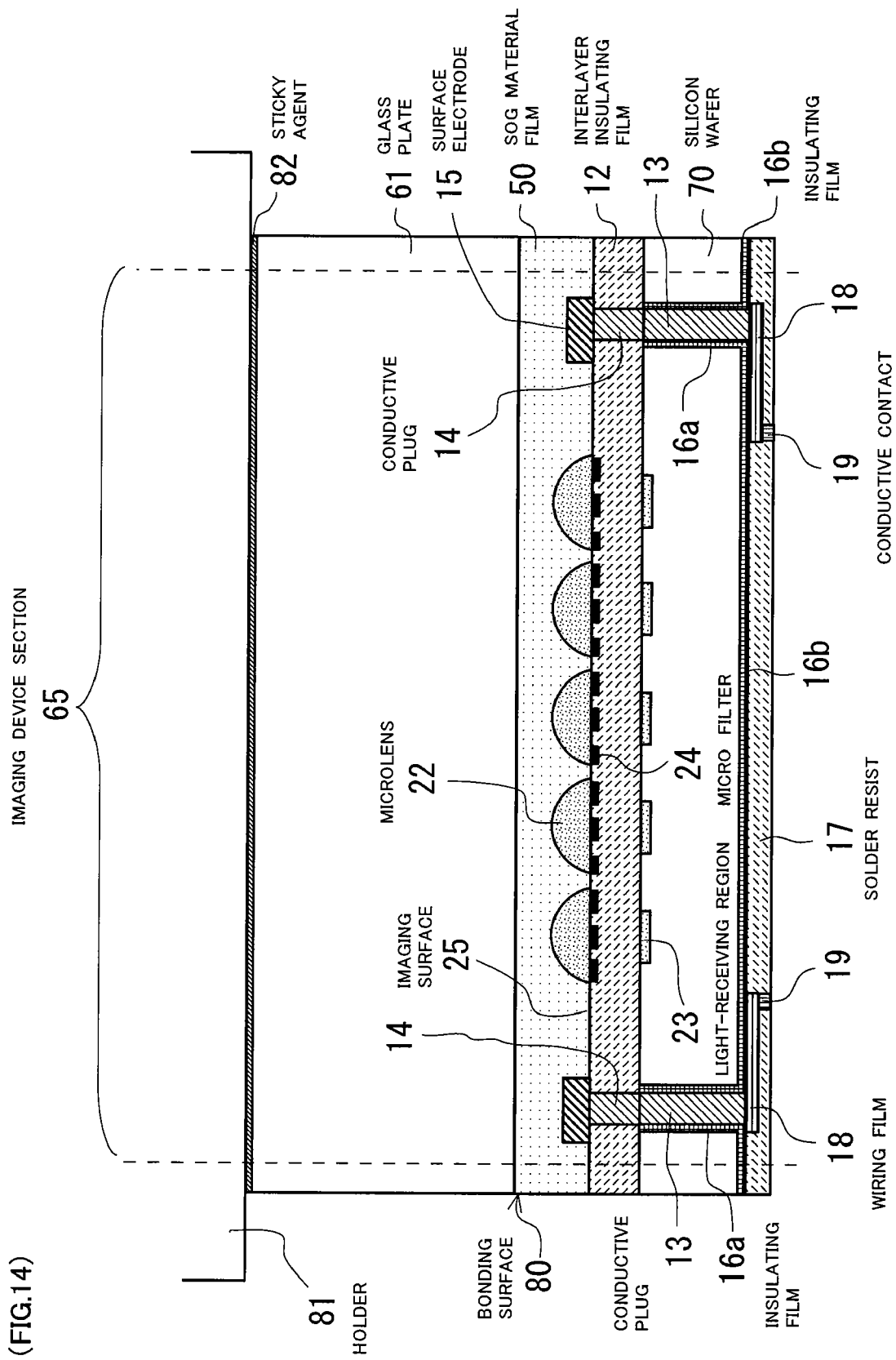
(FIG.14)

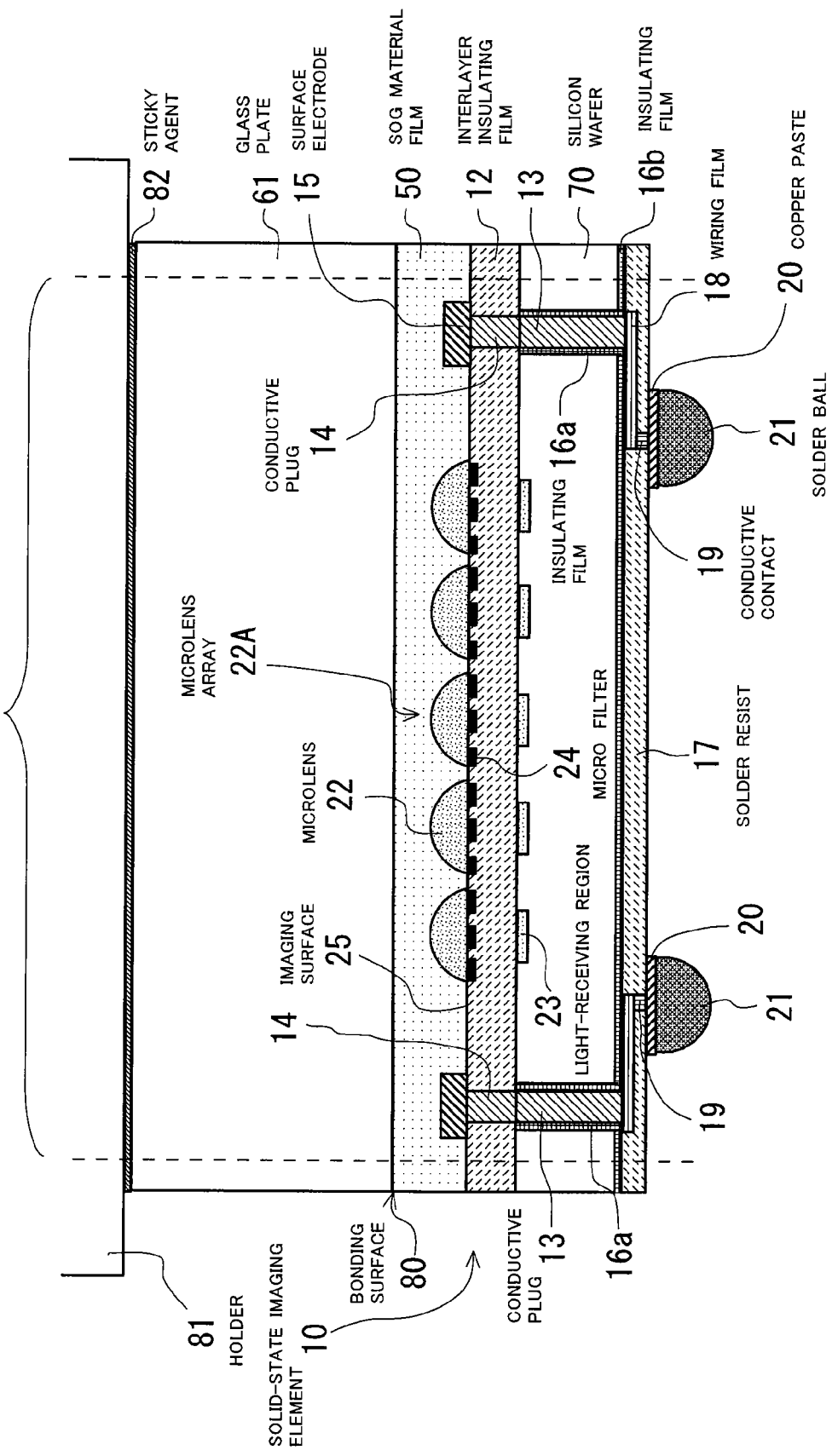
(FIG.15)

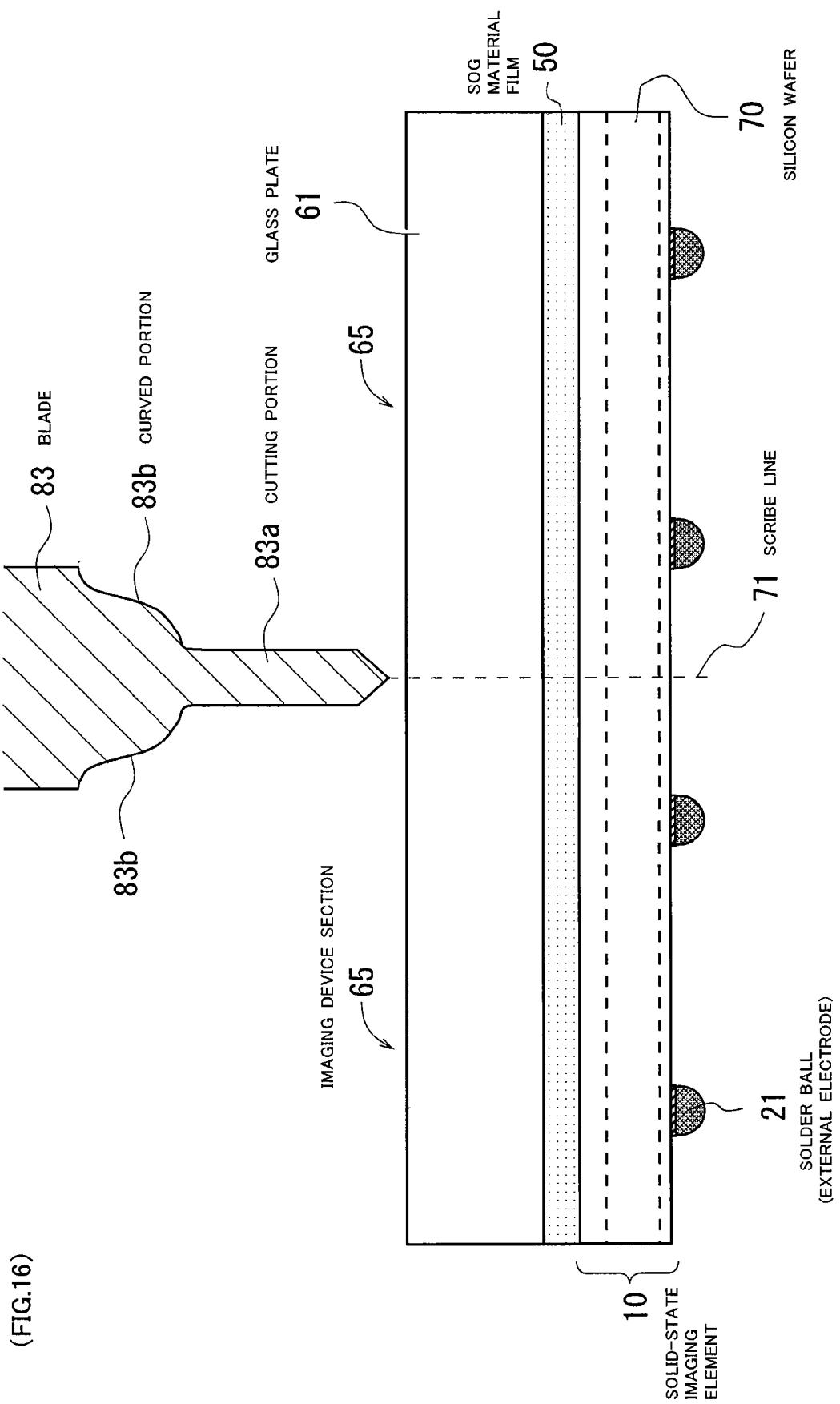
(FIG.16)

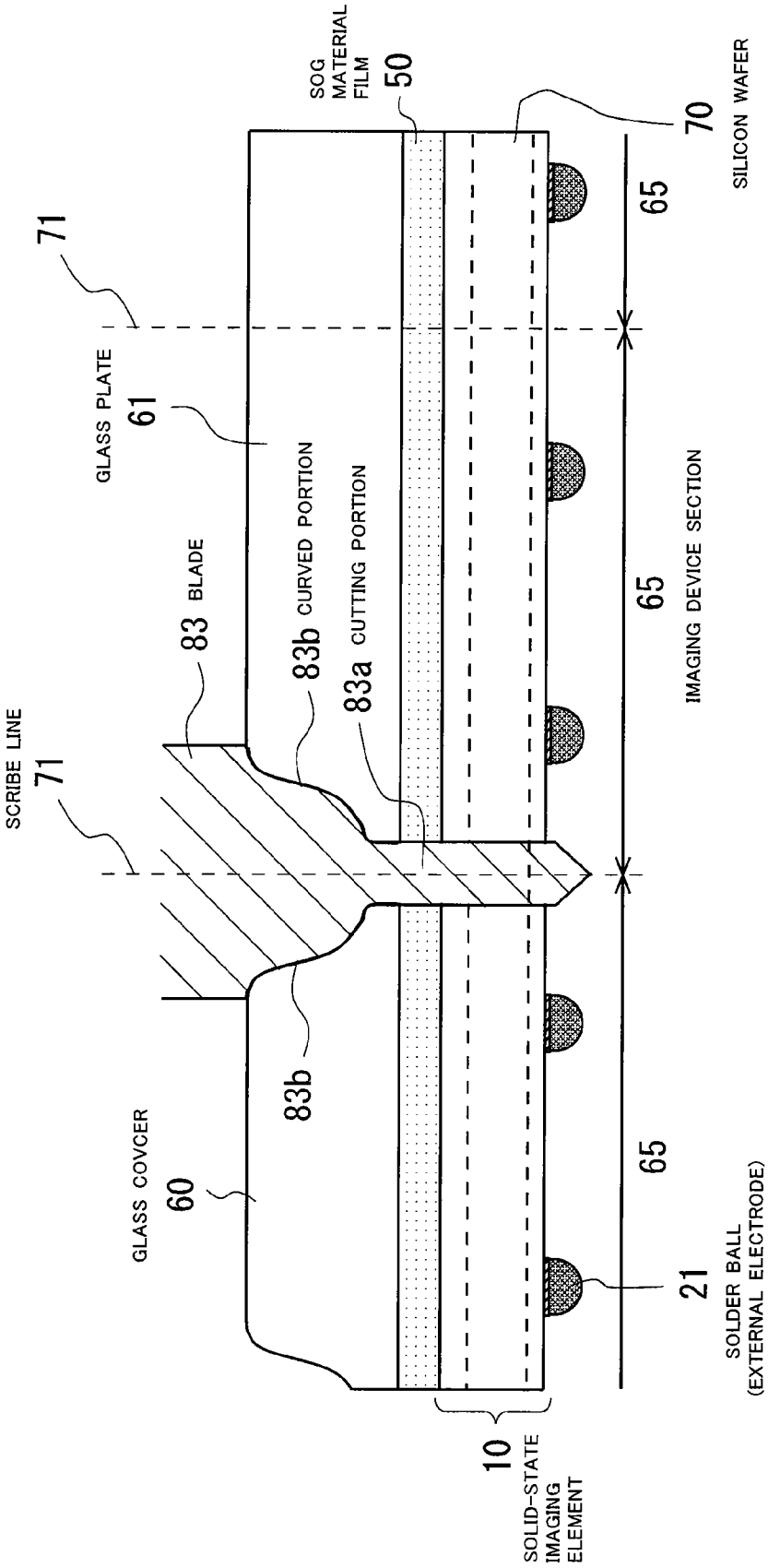
(FIG.17)

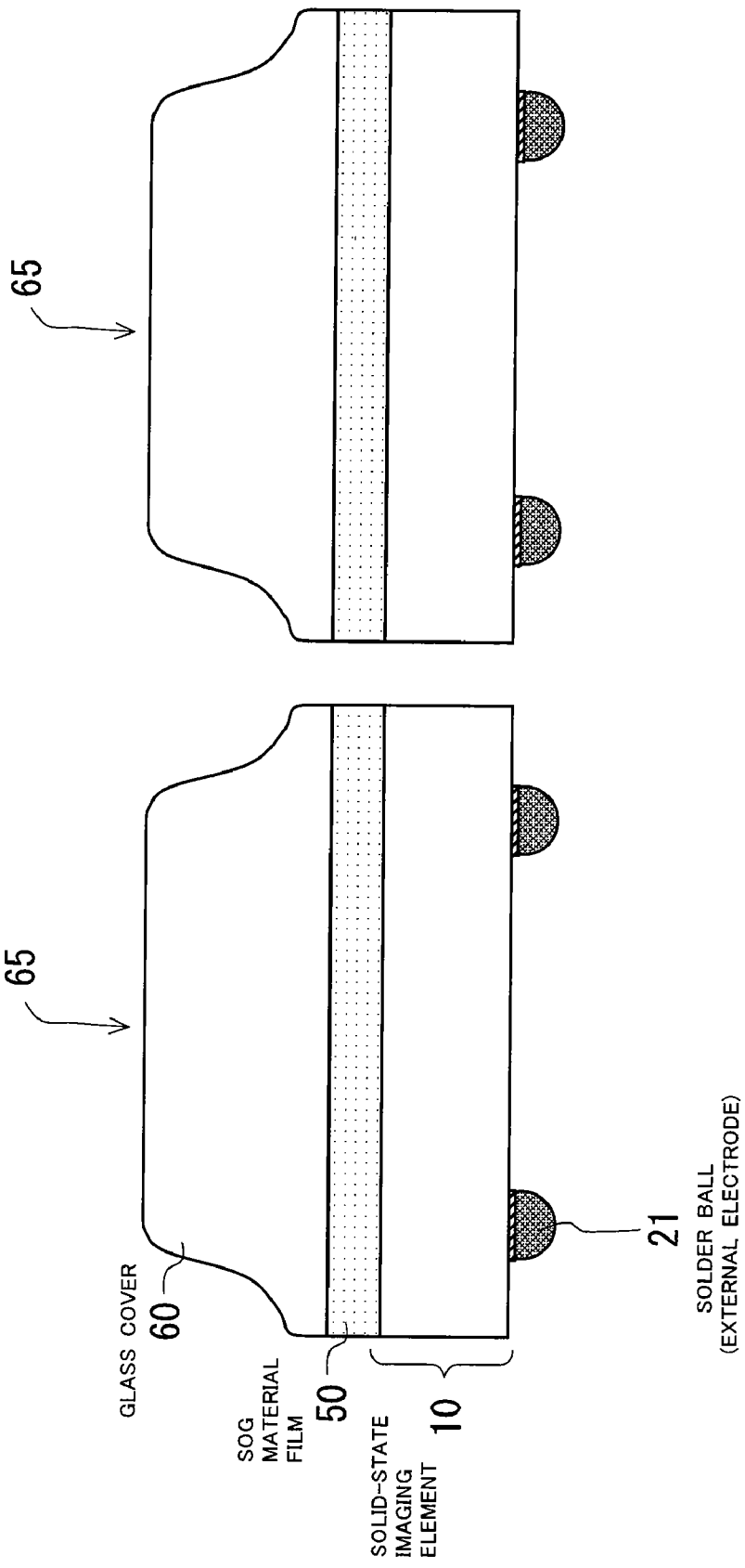

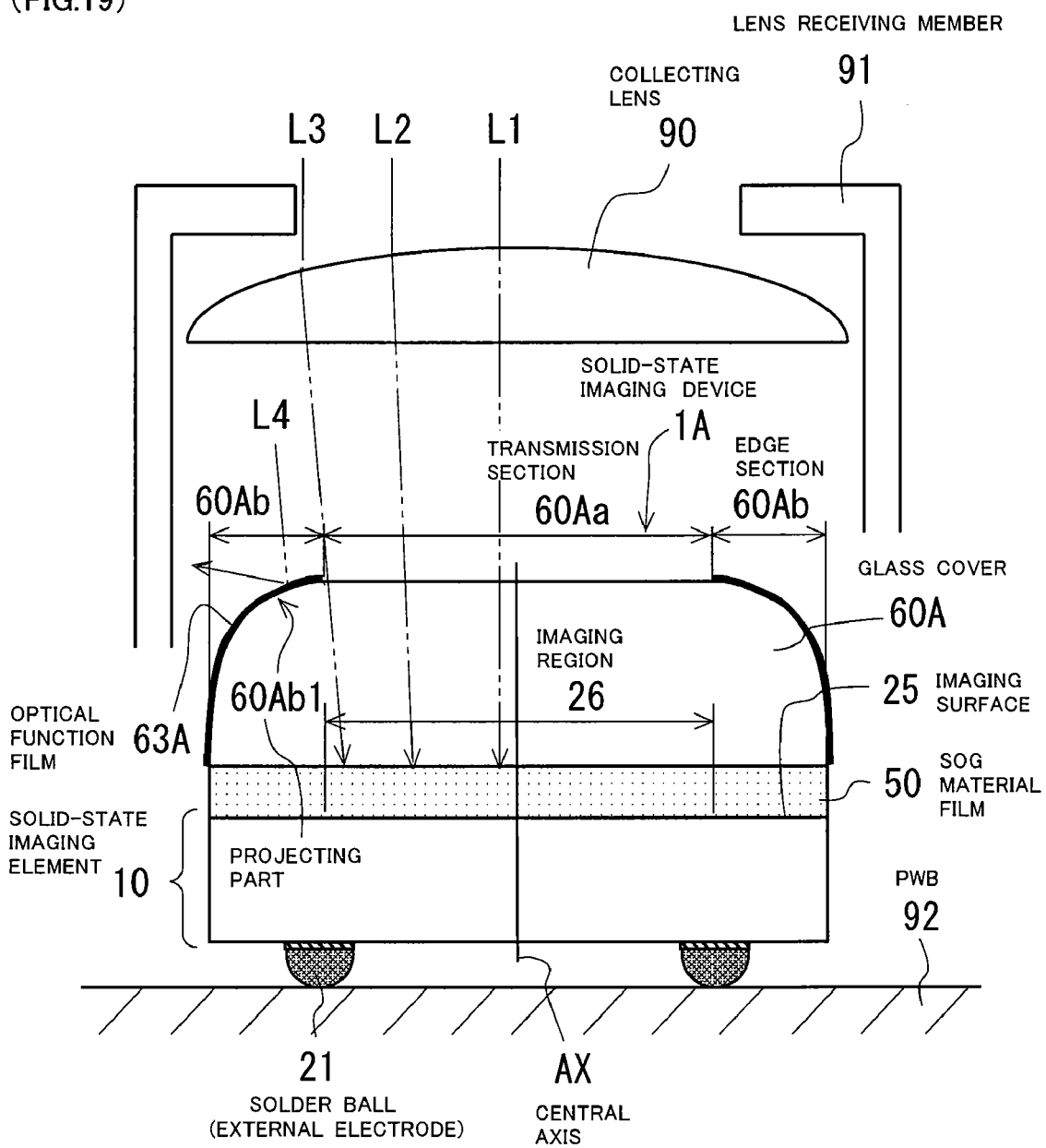
(FIG.19)

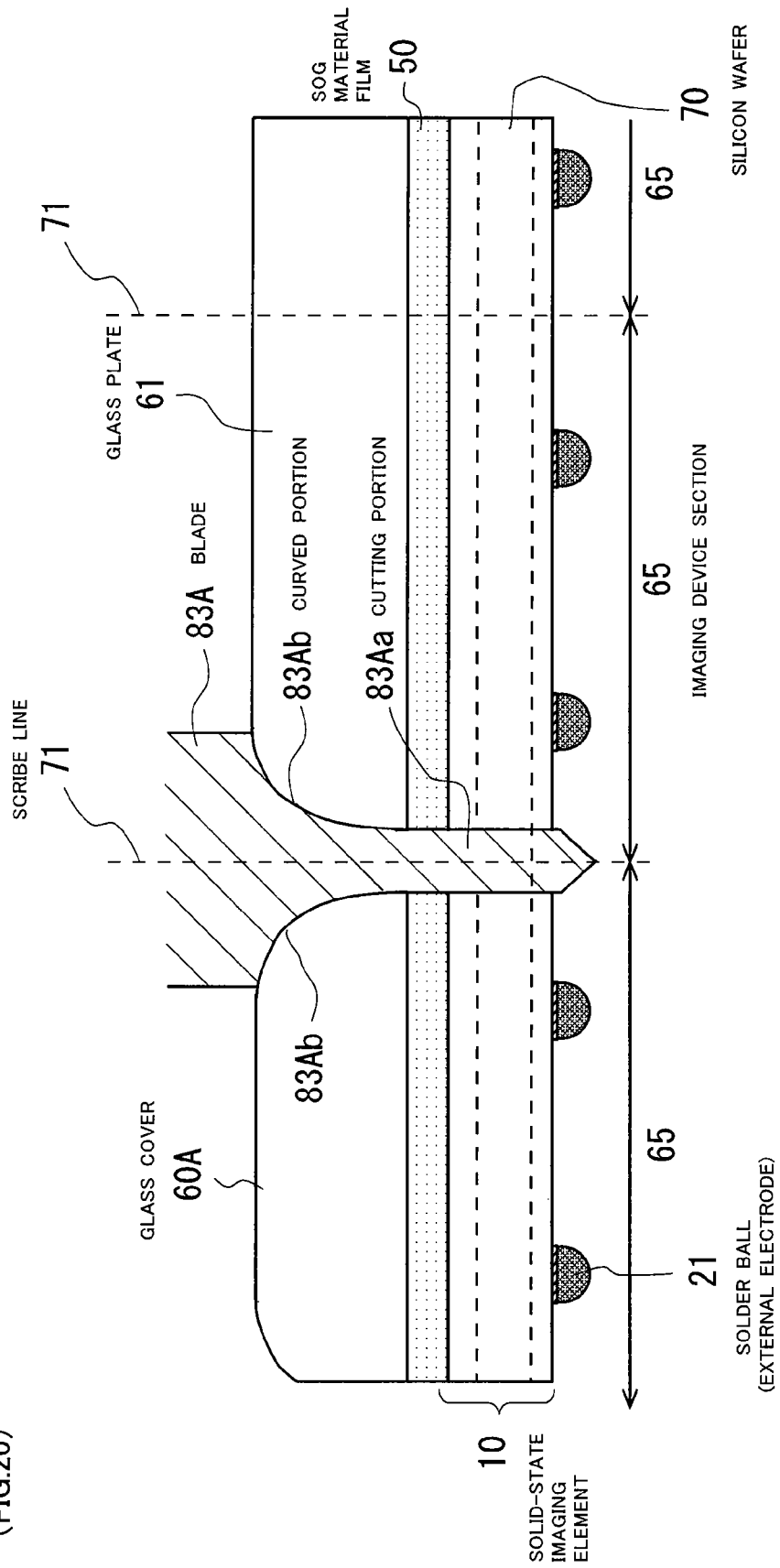

(FIG.21)
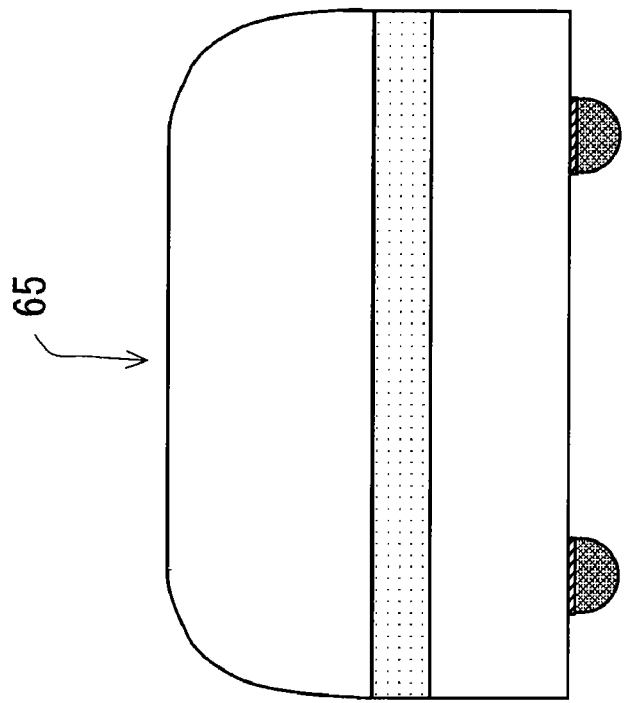
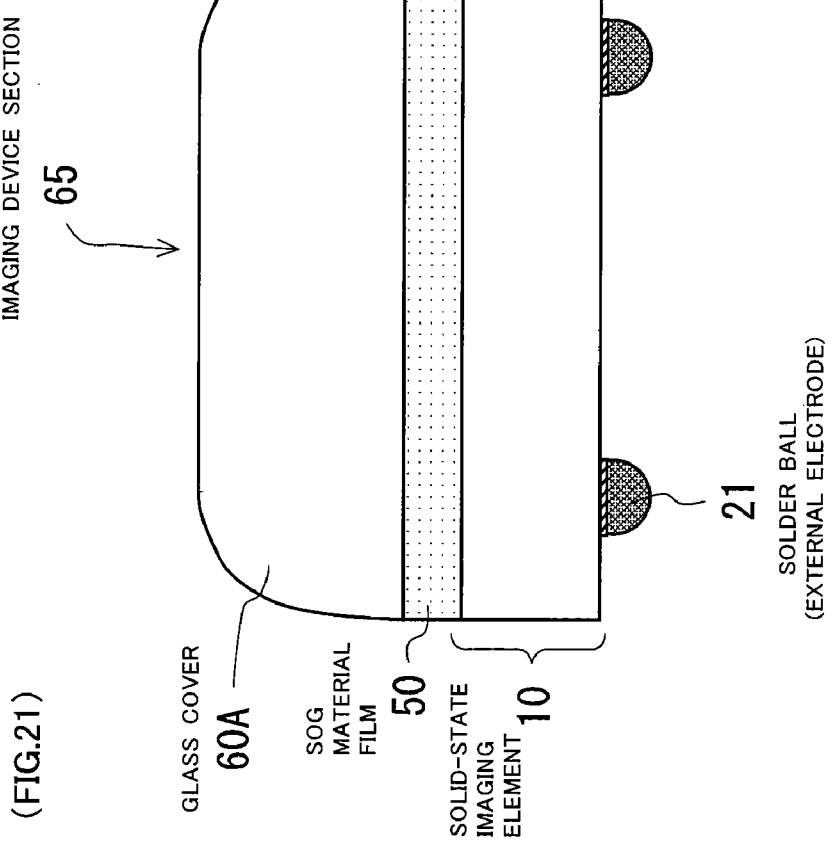

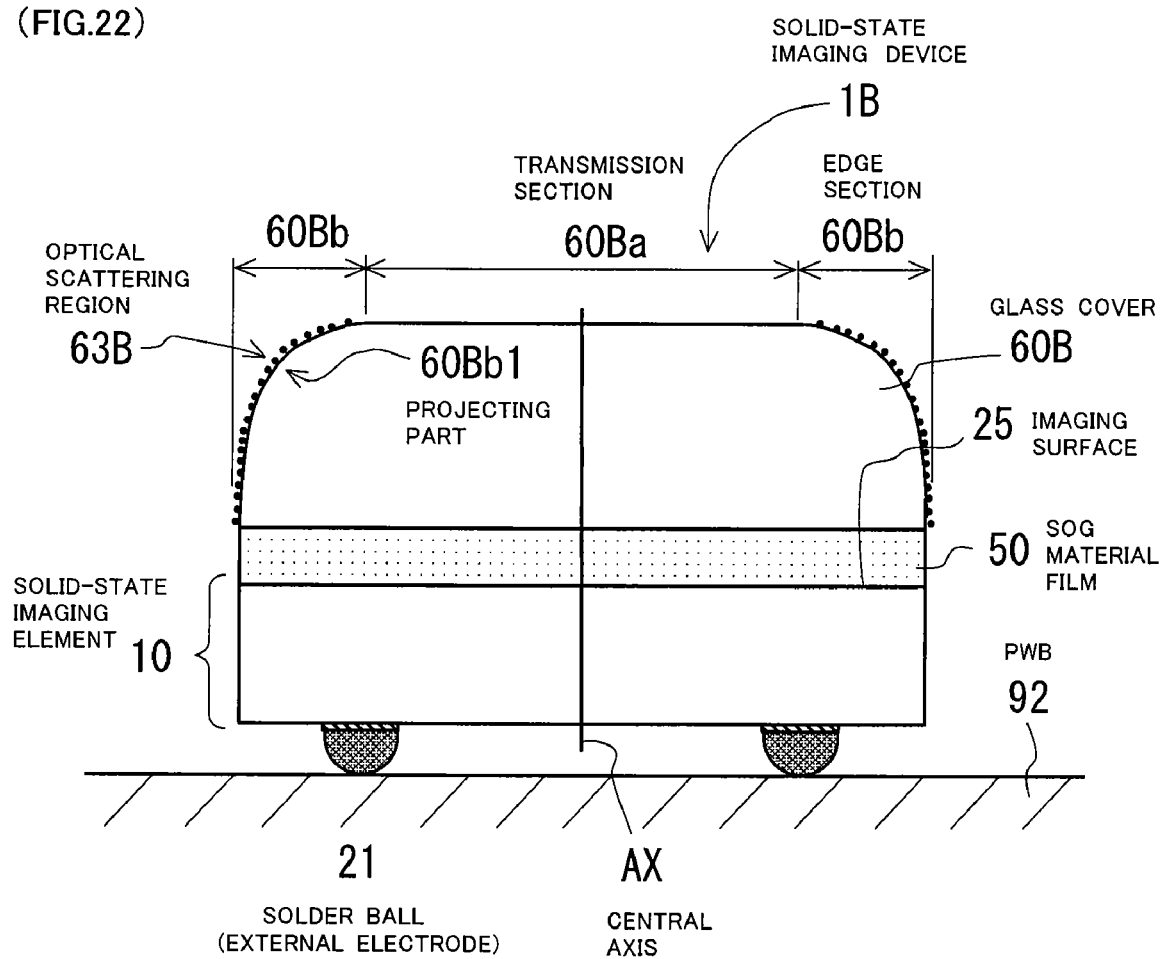

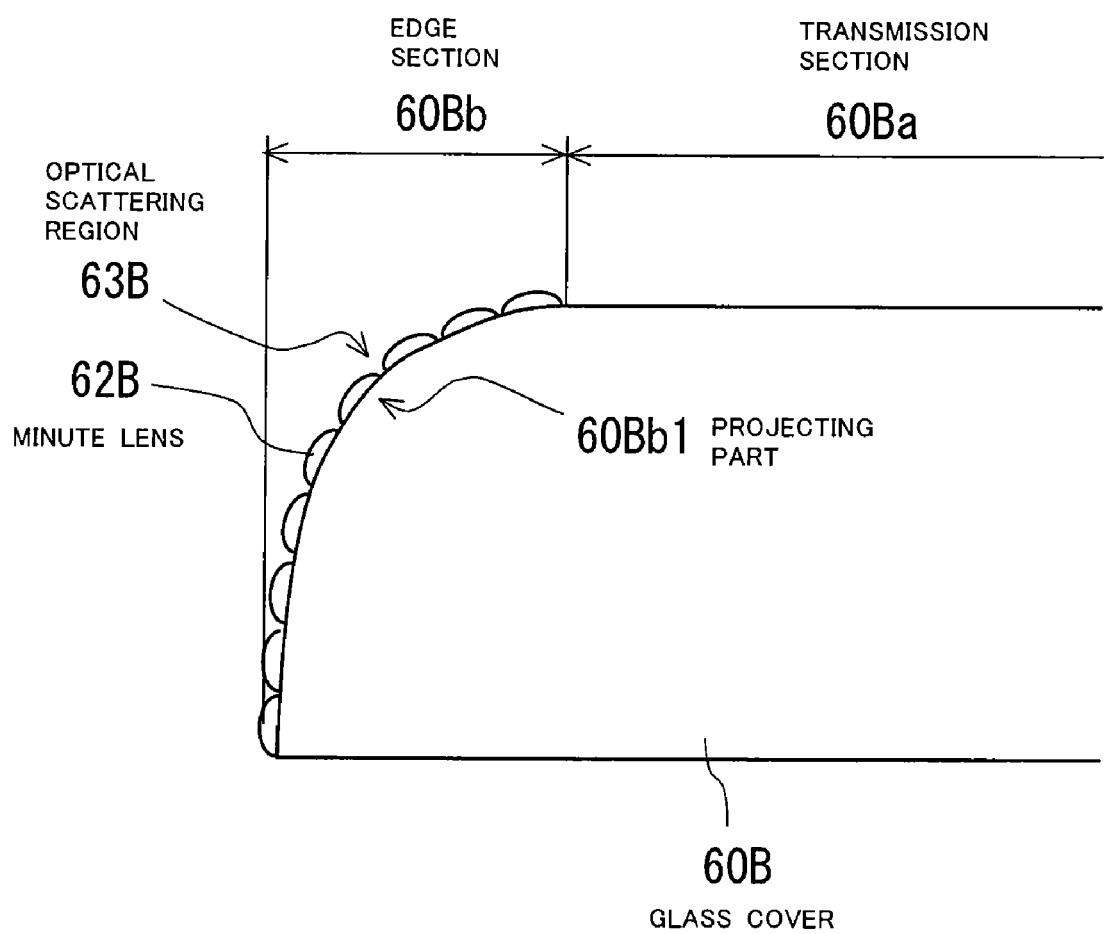

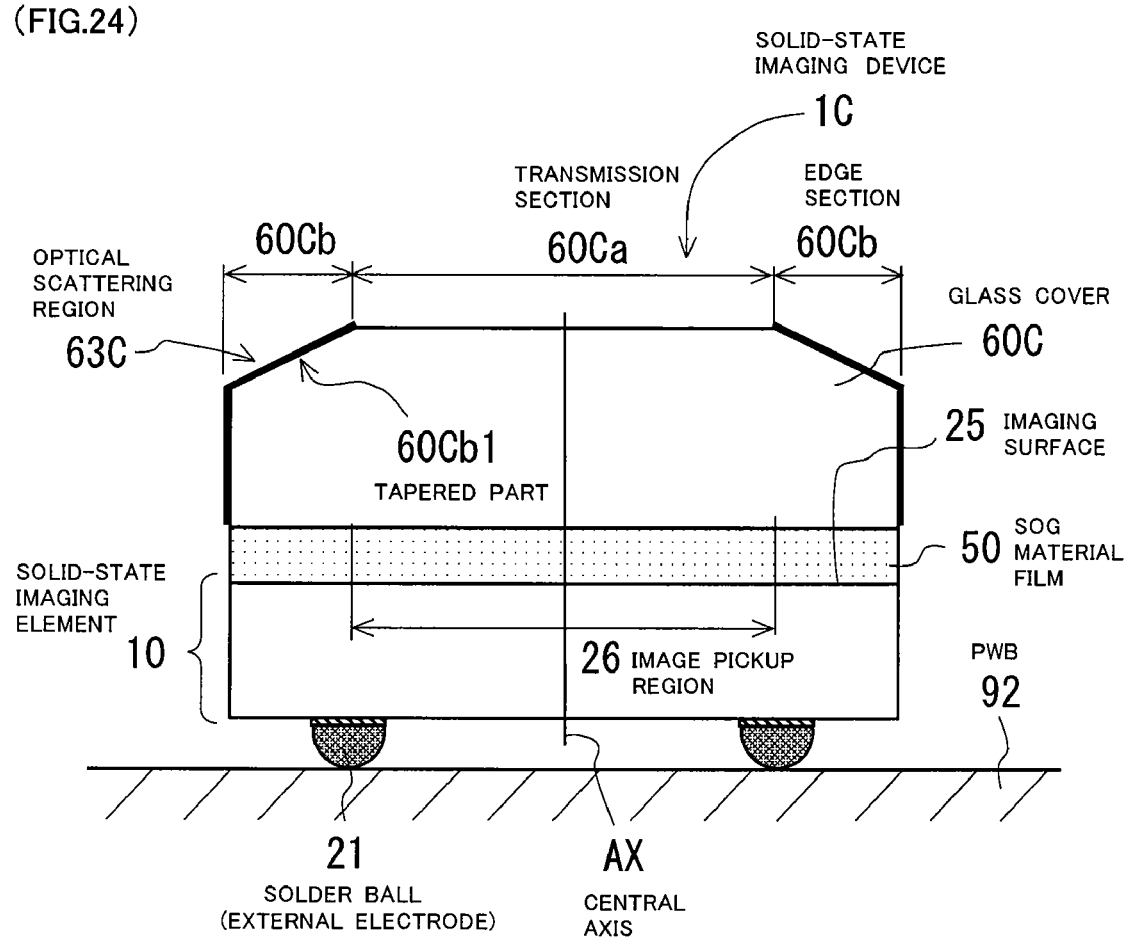

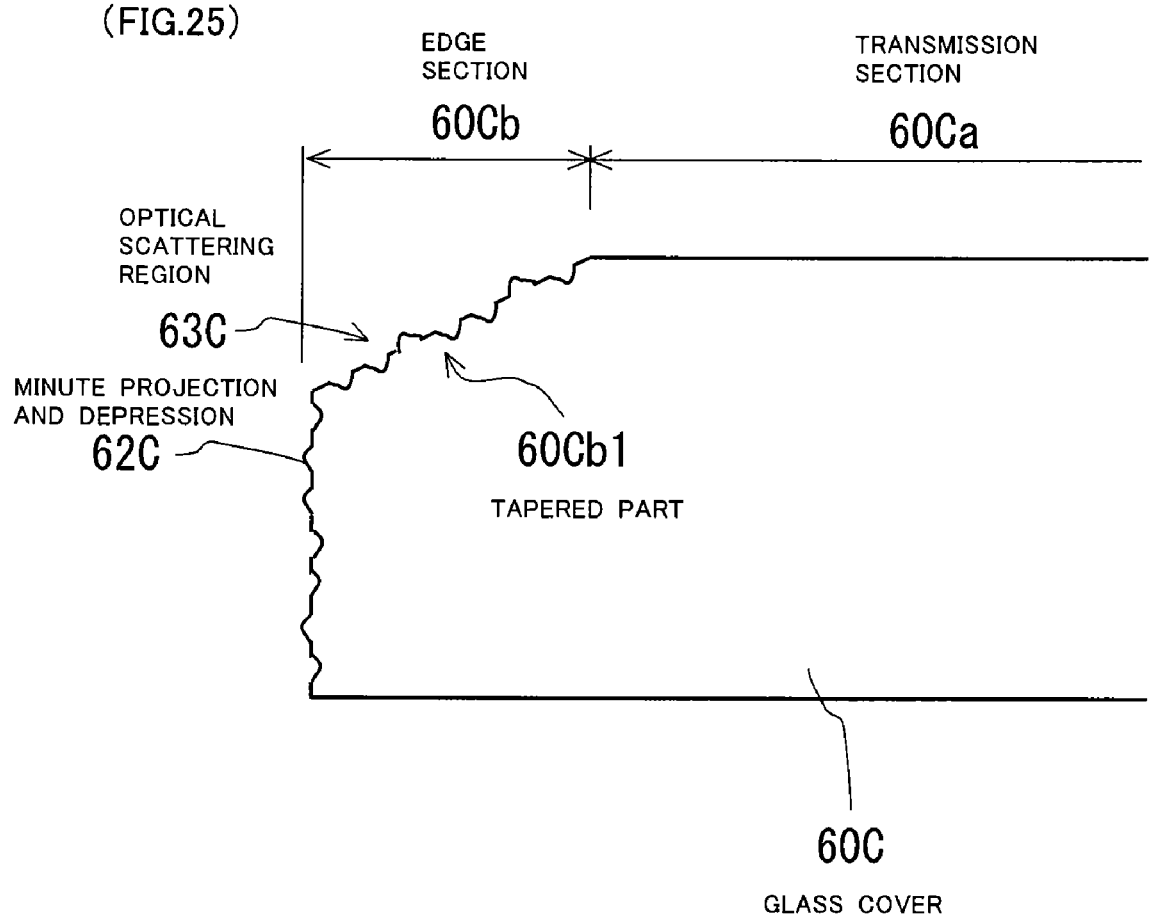

(FIG.26)
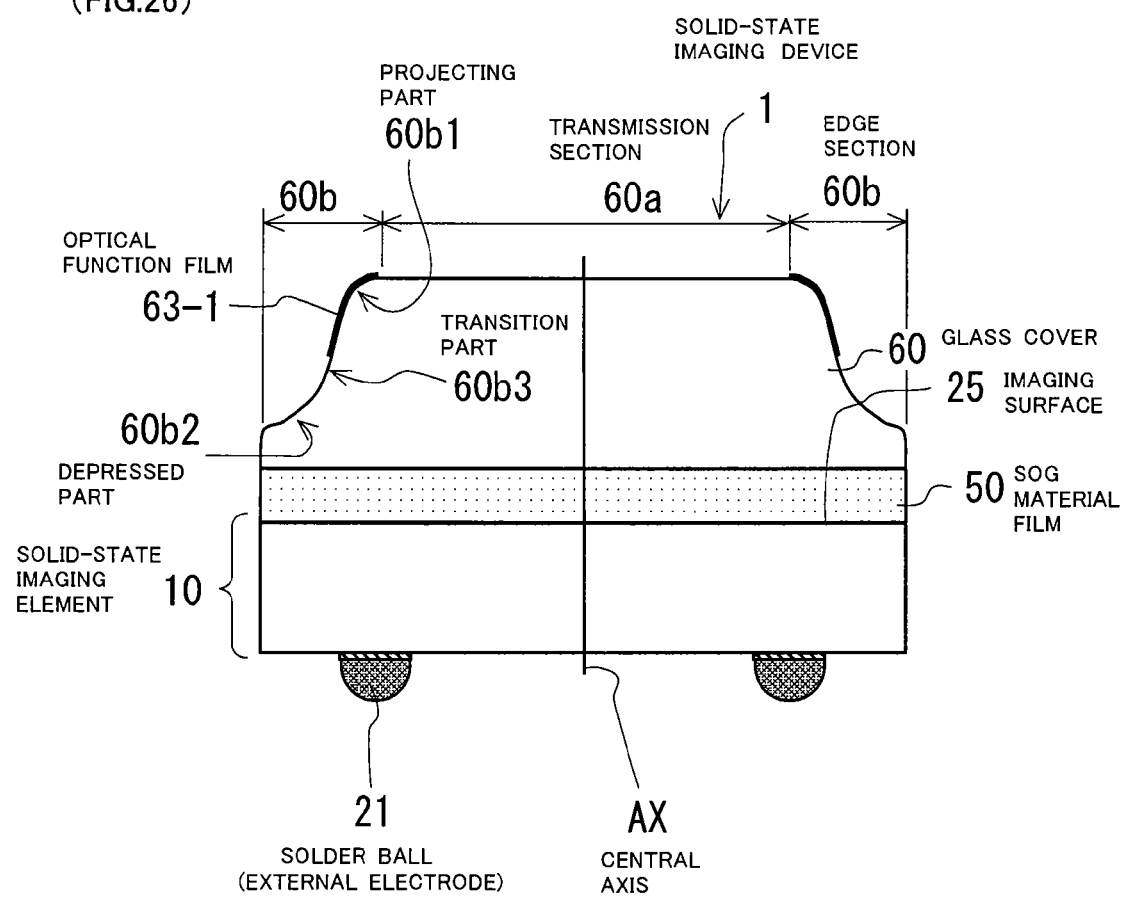

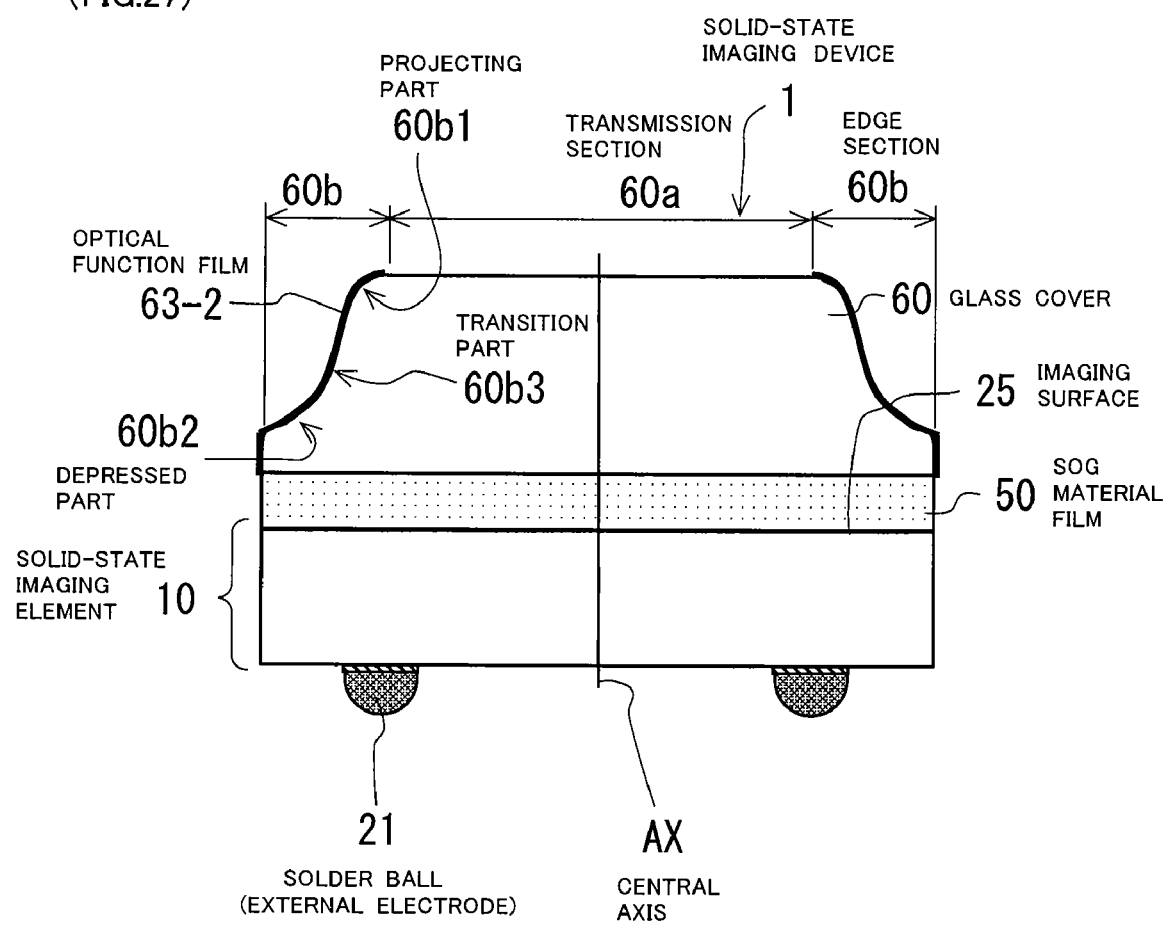

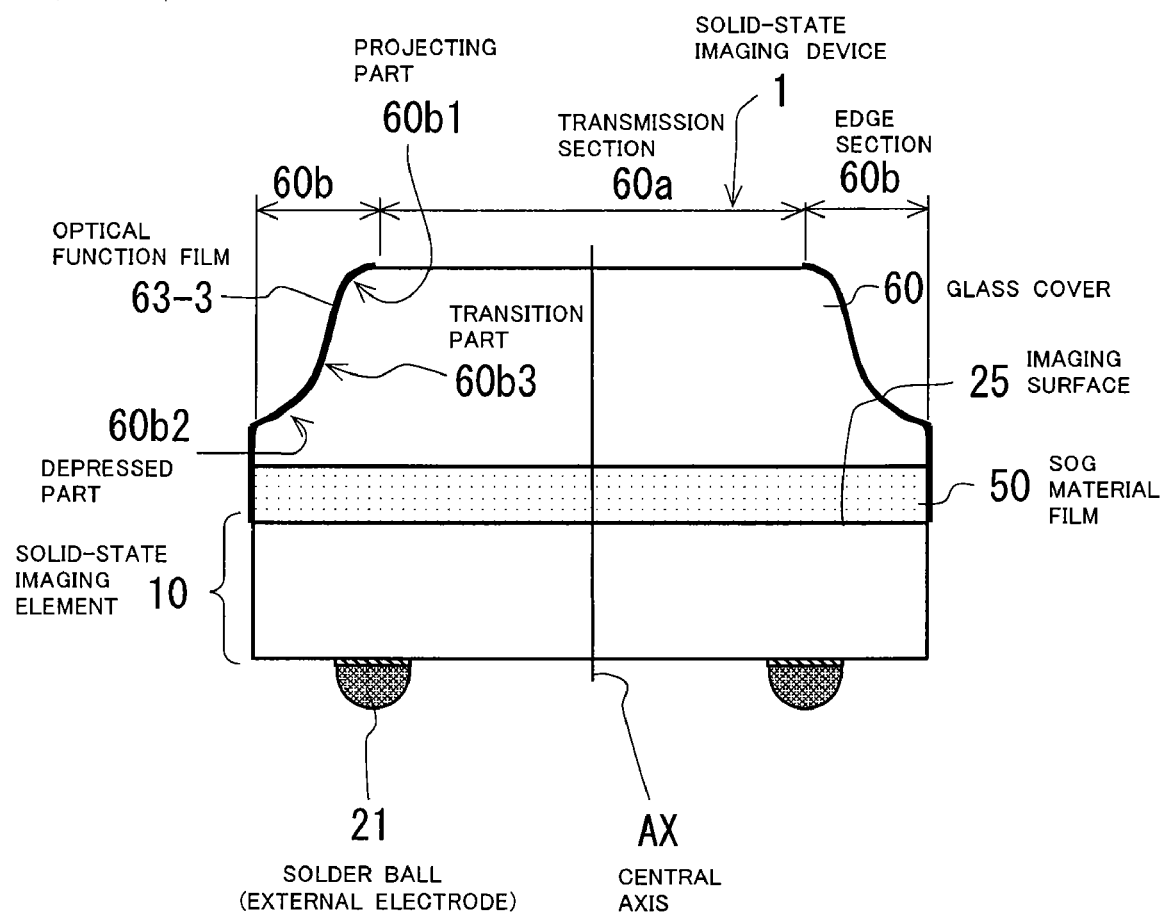
(FIG.28)

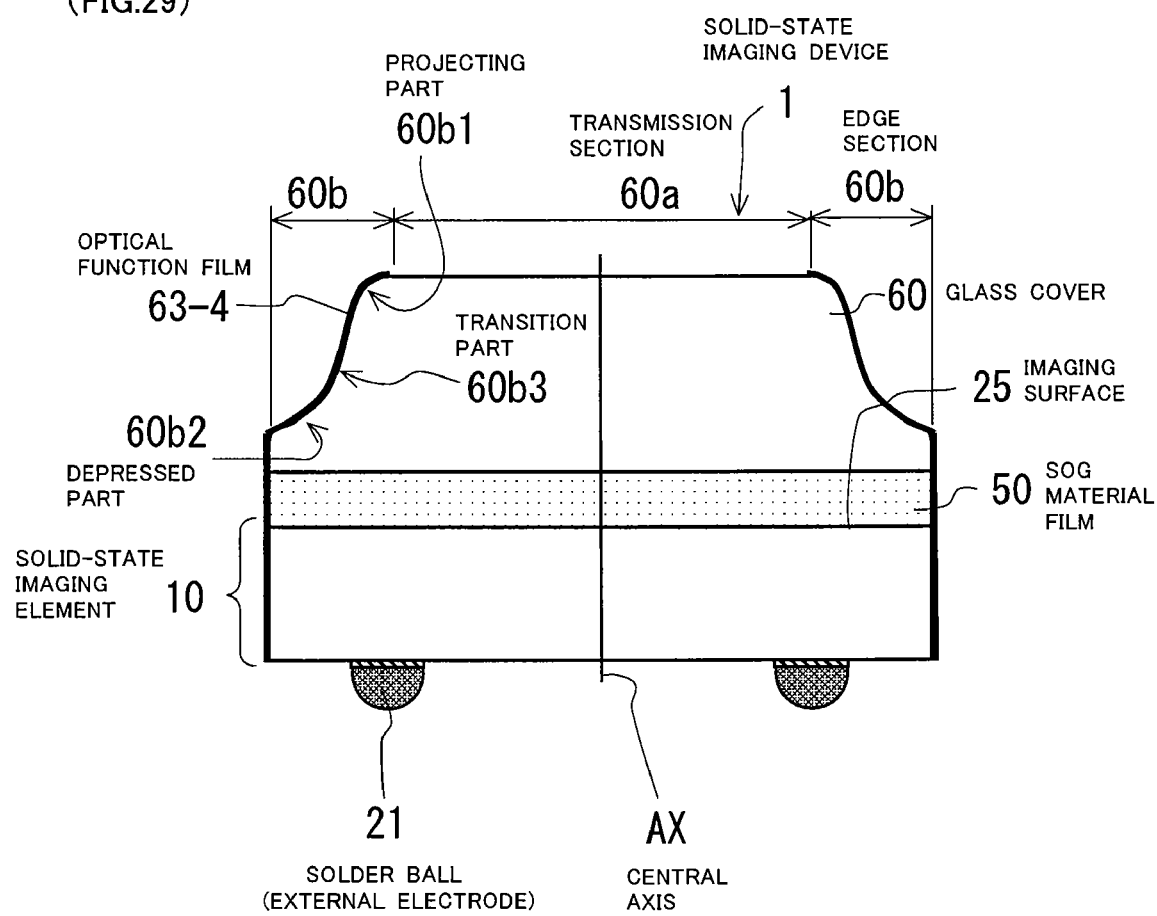
(FIG.29)

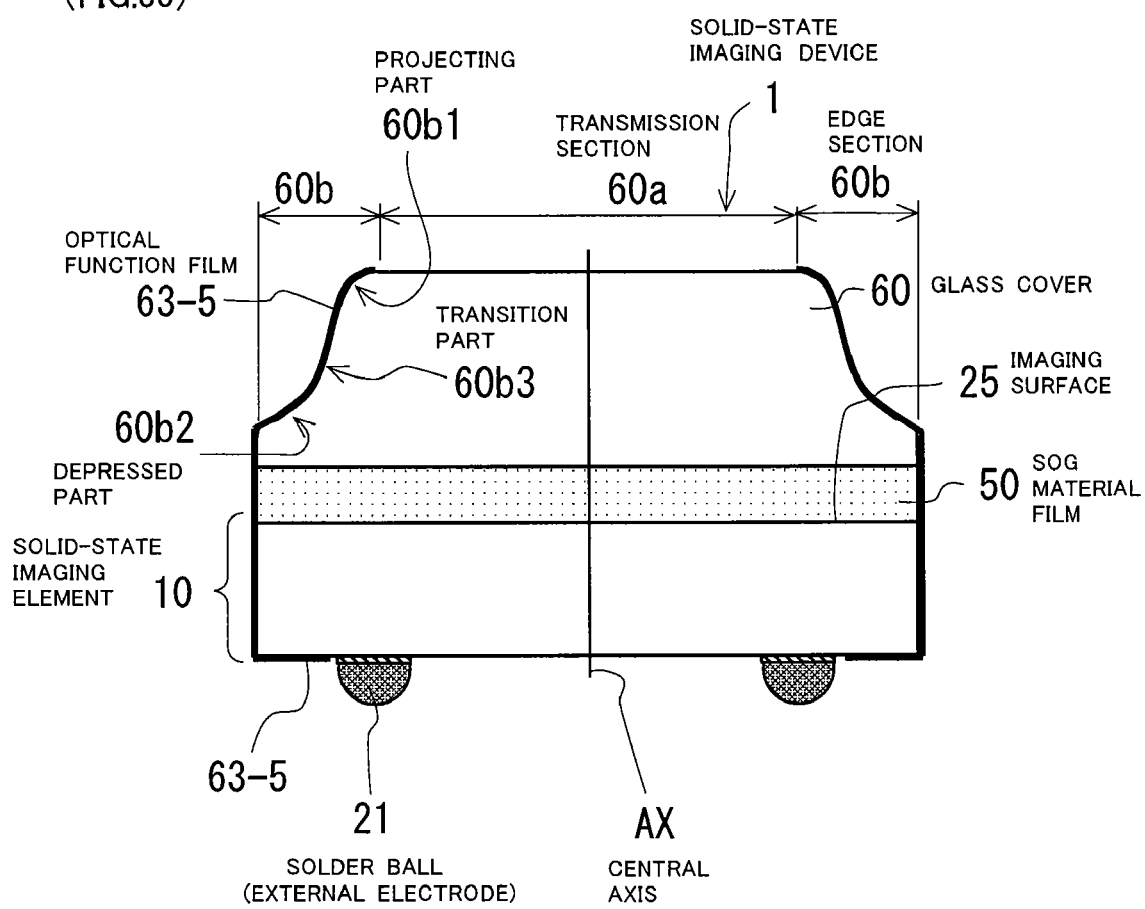

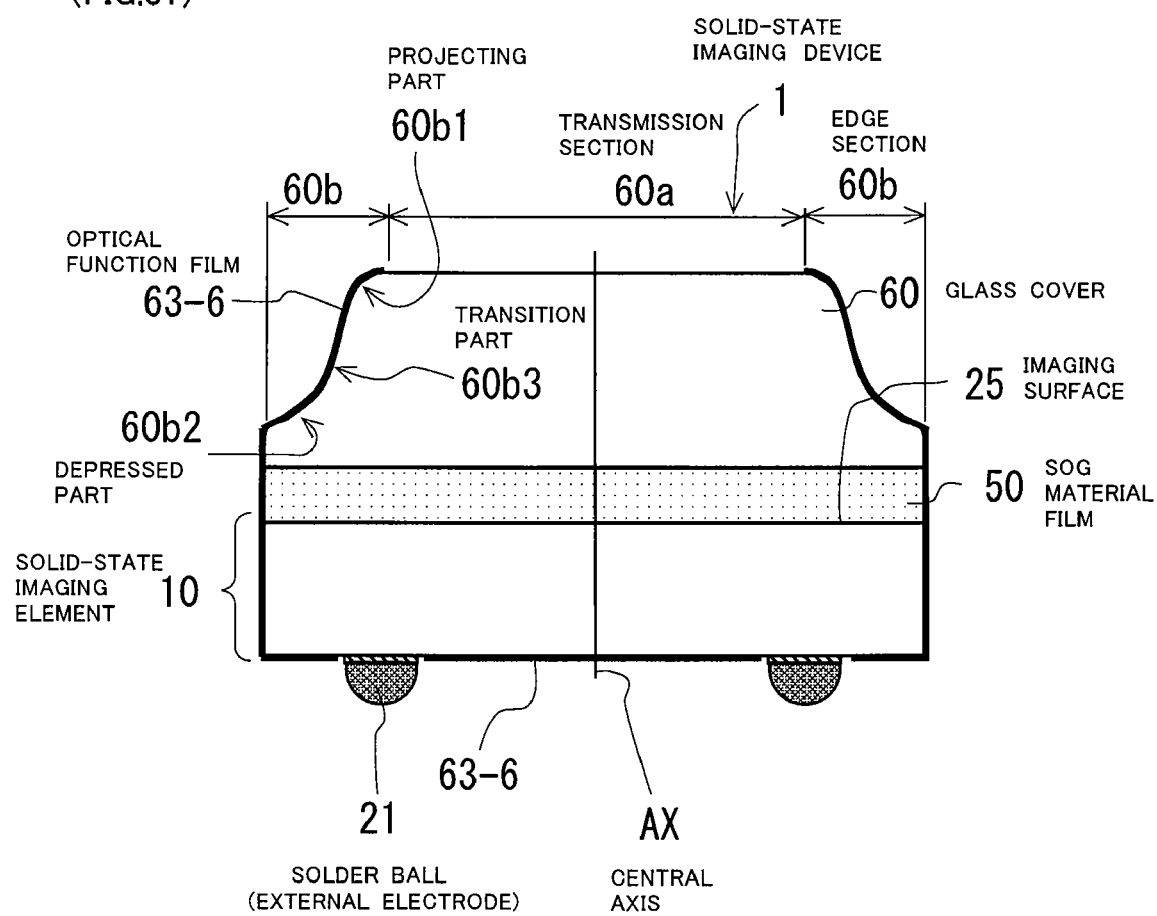

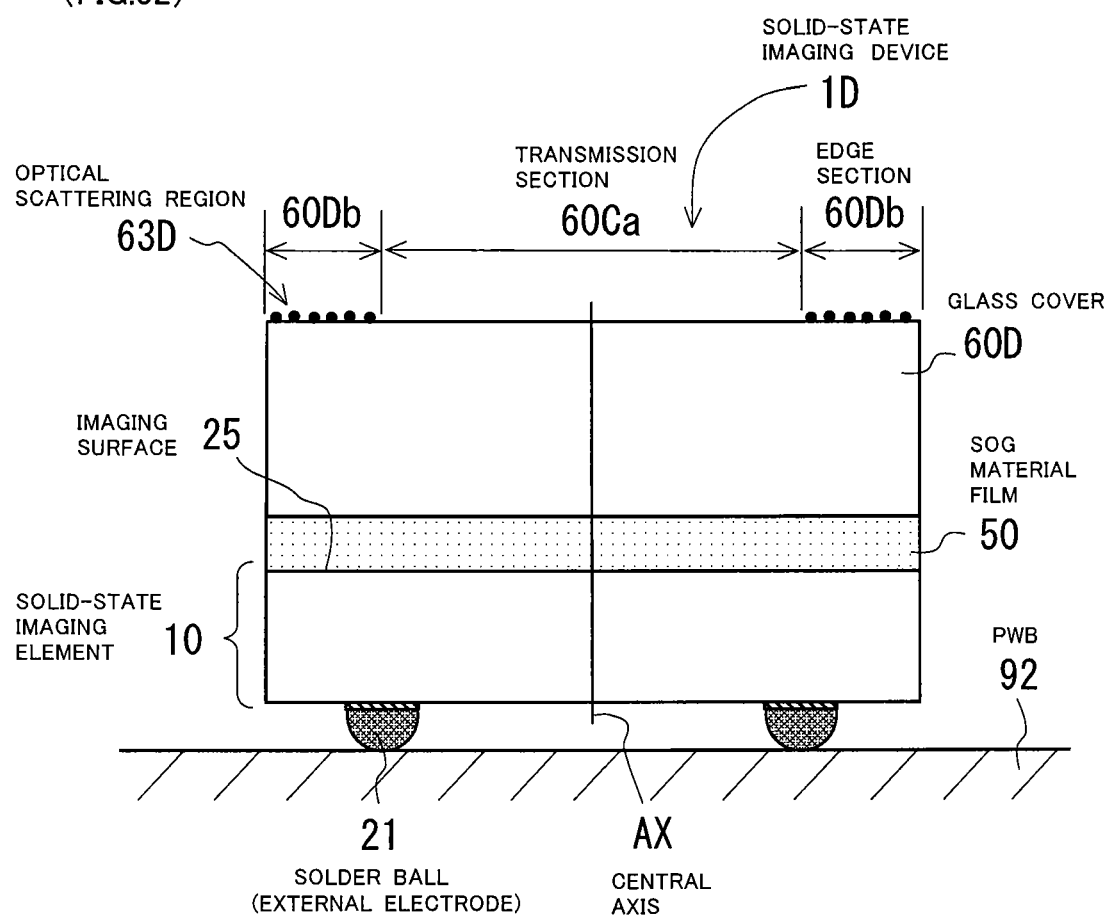
(FIG.32)

SOLID-STATE IMAGING DEVICE, METHOD OF FABRICATING THE SAME, AND CAMERA MODULE

This is a National Phase Application in the United States of International Patent Application No. PCT/JP2007/075332 filed Dec. 29, 2007, which claims priority on Japanese Patent Application No. 2006-356931, filed Dec. 29, 2006. The entire disclosures of the above patent applications are hereby incorporated by reference.

TECHNICAL FIELD

The present invention relates to a solid-state imaging device constituted by mounting a solid-state imaging element in a Chip-Size Package (CSP) and a method of fabricating the device. More particularly, the present invention relates to a solid-state imaging device that suppresses reflection of light by an edge section of a transparent cover that covers an imaging region of a chip-shaped solid-state imaging element with a simple structure, thereby making it possible to suppress noises caused by incidence of unnecessary light to thereby improve the image quality, and a fabrication method thereof, and a camera module using the solid-state imaging device.

BACKGROUND ART

In recent years, further miniaturization and higher functionalization of solid-state imaging devices have been seen. In connection with this, more and more solid-state imaging devices have been mounted on portable equipment such as mobile telephones and portable computers, and on motorcars, and as a result, the application field of these devices has been becoming wider and wider. One of the application fields of solid-state imaging devices is a digital camera; high image-quality digital single-lens reflex cameras using solid-state imaging devices have been put into practical use.

With such high image-quality digital cameras as described above, imaging operation is performed by converting external light incident on the imaging region of an imaging element by way of an imaging optical system such as a collecting lens into electric signals. Usually, the imaging optical system is located in a tubular lens receiving member (lens barrel), by which unnecessary external light is prevented from entering the imaging region.

The aforementioned solid-state imaging element comprises a transparent cover that covers the imaging region. Here, a region of the cover that corresponds to the imaging region is termed a "transmission section", and another region of the cover that is outside the "transmission section" is termed an "edge section". External light transmitted through the imaging optical system can enter the imaging region, if it passes through the transmission section; however, if it passes through the edge section, the external light does not enter the imaging region. For this reason, by setting the opening of the lens receiving member such that external light that has passed through the imaging optical system is transmitted only through the transmission section of the cover, the solid-state imaging device can be structured in such a way that only external light that has passed through both of the imaging optical system and the transmission section enters the imaging region. Here, external light that has passed through the imaging optical system and the transparent cover and directly entered the imaging region (without reflection at other positions) is termed "direct incident light".

By the way, as a technique for improving the image quality by preventing incidence of unnecessary light to the imaging region, various techniques have ever been developed and published.

For example, the Patent Literature 1 (Japanese Unexamined Patent Publication No. 2004-140497) discloses a camera module comprising a light intercepting wall that extends around the entire periphery of a connecting portion between a lens barrel (which incorporates a colleting lens) and a package body in order to block external light (unnecessary light) that is incident through gaps formed at other positions than the bonding spots between the lens barrel and the package body, thereby preventing such the unnecessary light from entering the imaging region of a solid-state imaging element. (See FIGS. 1 and 2 and Abstract.)

The Patent Literature 2 (Japanese Unexamined Patent Publication No. 2005-109092) discloses a solid-state imaging device comprising light receiving pixels, a microlens array whose microlenses are arranged two-dimensionally within at least a range including these light receiving pixels corresponding to the respective light receiving pixels, and a transparent member (a transparent cover) placed on the incidence side of the microlens array. A protruding part is formed to be integral with the transparent member on the opposing side of this member to the microlens array at a position that does not overlap with the light receiving pixels. The transparent member is supported by this protruding part. The protruding part surrounds the light receiving pixels like a picture frame, and is formed higher than the height of the microlens array. In this way, an air layer is formed between the transparent member and the microlens array.

Coating for blocking infrared light (infrared-light cut coating) is applied to the incidence side of the aforementioned transparent member. A light-blocking section is formed by light-tight printing or the like outside the region through which a pencil of light of an object (external light) sent from the imaging optical system penetrates.

The Patent Literature 2 discloses an imaging apparatus equipped with the solid-state imaging device having the aforementioned structure also. This imaging apparatus comprises the aforementioned imaging device, and an outer frame member incorporating the imaging optical system (first and second lenses) that forms an image of an object on this imaging device. A compression coil spring is incorporated into the outer frame member. The top end opening of the outer frame member is covered with a lid member.

With the solid-state imaging device of the Patent Literature 2, because of the aforementioned structure, the surface of the microlens array (the imaging region) is sealed with the transparent member from the initial step of the fabrication process sequence of the aforementioned imaging apparatus and therefore, the surface of the microlens array can be protected from moisture and dust. Accordingly, the fabrication yield reduction due to dust adhesion during the fabrication process sequence can be minimized, which makes it possible to reduce the cost through improvement of the quality product rate. (See FIGS. 1 to 4, Paragraphs 0045 to 0065 and 0105 to 0106, and Abstract.)

The Patent Literature 3 (Japanese Unexamined Patent Publication No. 2001-274370) discloses a package for a light receiving element that prevents false signals, and a solid-state imaging device that reduces flare. This package comprises a container having a cavity for storing a light-receiving element, and internal terminals for electrical connection to the light-receiving element, wherein the container is sealed with an optically transparent cover. Between the cavity and the cover, a light-blocking member having an opening that leads incident light and a tapered part that blocks stray light is located. The tapered part of the light-blocking member is formed in the peripheral area of this member to surround the opening thereof. Since the opening is located to be superposed on the light-receiving region of the light-receiving element, the tapered part is located to surround the light-receiving region. Preferably, an optical absorption layer formed by a black paint, Kinguro, or the like is formed on the light-blocking member.

With the package for a light receiving element of the Patent Literature 3, by the aforementioned structure, light that has obliquely penetrated through the transparent cover to enter the inside of the container (oblique incident light) is blocked by the light-blocking member. For this reason, there is no possibility that the oblique incident light is reflected on the surface of the light-receiving element and scattered by the metal thin lines connecting electrically the light-receiving element to the internal terminals, the inner face of the container, or the like, thereby inducing scattered light. Accordingly, false signals caused by incidence of the scattered light on the light-receiving region of the light-receiving element are prevented from occurring. If the optical absorption layer is formed on the light-blocking member, the scattered light irradiated to this light-blocking member is absorbed by the optical absorption layer; therefore, the false signal preventing effect can be enhanced.

With the solid-state imaging device of the Patent Literature 3, a solid-state imaging element is mounted on the aforementioned package for a light-receiving element instead of the light-receiving element. Flare caused by incidence of the scattered light on the imaging region of the solid-state imaging element is prevented from occurring by the light-blocking member. (See claims 1 and 8, FIGS. 1 to 2 and 11, Paragraphs 0014 to 0018 and 0043 to 0053.)

The Patent Literature 4 (Japanese Unexamined Patent Publication No. 2006-41277) discloses a solid-state imaging device comprising a solid-state imaging element provided on one surface of a semiconductor substrate, and a transparent plate (a cover glass) that seals the upper side of this element and that has end faces approximately tapered toward the upper surface from the lower surface. With this device, The end faces of the cover glass are tapered and therefore, reflected light, which is generated by oblique incidence of light on the end faces of the cover glass and reflection thereon and which reaches the solid-state imaging element, does not exist. Accordingly, noises due to the aforementioned reflected light can be reduced similar to the case where anti-reflection films are provided on the end faces. (See claim 3, FIGS. 10 to 11, Paragraphs 0043 to 0044.)

The Patent Literature 4 further discloses a solid-state imaging device comprising a cover glass that has end faces on which anti-reflection films are provided instead of the tapered end faces, and another solid-state imaging device comprising a cover glass whose end faces are roughened instead of providing the anti-reflection films. (See claim 1, FIGS. 1 to 3 and FIGS. 12 to 13, Paragraphs 0030, 0046 to 0047.)

Patent Literature 1: Japanese Unexamined Patent Publication No. 2004-140497
Patent Literature 2: Japanese Unexamined Patent Publication No. 2005-109092
Patent Literature 3: Japanese Unexamined Patent Publication No. 2001-274370
Patent Literature 4: Japanese Unexamined Patent Publication No. 2006-41277

DISCLOSURE OF THE INVENTION

Problems to be Solved by the Invention

By the way, according to the research of the inventor, it was discovered that image quality degradation of the aforementioned conventional digital camera comprising an imaging optical system and a solid-state imaging element is caused by external light that penetrates through the imaging optical system to reach the edge section of the transparent cover covering the imaging region of the imaging element, and reflected light generated by reflection of external light in the cover.

Specifically, the conventional digital camera having the aforementioned structure is designed in such a way that only external light (direct incident light) that is incident directly on the imaging region by way of the imaging optical system and the transparent cover (without reflection at other positions) reaches the imaging region by the use of the lens receiving member. However, in reality, (a) the external light that has passed though the imaging optical system may reach the edge section of the transparent cover due to dimension errors during fabrication and/or placement errors during assembly. Such the external light as described here will enter the inside of the cover through the edge section to reach the imaging region and therefore, it will be a cause of the image quality degradation.

Moreover, (b) a part of the external light that has reached the transmission section of the cover may be reflected by the surface of this transmission section and then, the external light thus reflected may be further reflected by the imaging optical system toward the cover, reaching the edge section of the cover. Such the external light as described here also will reach the imaging region through the inside of the cover and therefore, it will be a cause of the image quality degradation similar to the case (a).

Furthermore, (c) a part of the external light that has entered the inside of the cover through the transmission section may be reflected by the exit-side (imaging region side) end face of the cover, and reflected by the incidence-side (opposite side to the imaging region) end face of the cover, and further reflected by the exit-side end face of the cover; in this way, a part of the external light may propagate in the cover while reflected repeatedly in the cover. Such the external light as described here also will reach the imaging region through the exit-side end face of the cover, although the amount of this light is small. Therefore, this light will be a cause of the image quality degradation also.

In addition, reflected light which is generated by reflection of external light that has reached the transmission or edge section of the cover, or by reflection of a part of this external light, on the surface of this transmission or edge section, may reach the inner face of the lens receiving member. Such the reflected light as described here is absorbed by the optical absorption film formed on the inner face of the lens receiving member and therefore, this light does not affect the image quality badly.

It is usual that the image quality degradation due to the aforementioned causes (a) to (c) does not induce any problem in ordinary digital cameras. However, this image quality degradation is conspicuous in the aforementioned high image-quality digital single-lens reflex cameras and therefore, it needs to be eliminated by some method.

All of the prior-art techniques disclosed in the aforementioned Patent Literatures 1 to 3 are to prevent unnecessary light from entering the imaging region of the solid-state imaging element to improve the image quality; however, they do not refer to the image quality degradation due to the aforementioned causes (a) to (c).

The prior-art technique disclosed in the aforementioned Patent Literature 4 is to prevent the image quality degradation caused by reflected light that enters obliquely the side end face of the cover glass and that is reflected by this side end face to reach the solid-state imaging element. Therefore, it may be said that this prior-art technique relates to prevention of the image quality degradation due to the aforementioned cause (a) or (b). However, this technique is limited to this and does not refer to the image quality degradation due to the aforementioned cause (c).

Thus, an object of the present invention is to provide a solid-state imaging device that makes it possible to prevent the image quality degradation due to the aforementioned causes (a) to (c) with a simple structure.

Another object of the present invention is to provide a method of fabricating a solid-state imaging device that makes it possible to prevent the image quality degradation due to the aforementioned causes (a) to (c) with simplified steps.

Still another object of the present invention is to provide a camera module that makes it possible to prevent the image quality degradation due to the aforementioned causes (a) to (c) with a simple structure.

Other objects of the present invention not specifically mentioned here will become clear from the following description and drawings attached.

Means for Solving Problems (1) According to the first aspect of the present invention, a solid-state imaging device is provided, which comprises:
a solid-state imaging element having an imaging region; and
a transparent cover covering a whole surface of the imaging region;
wherein the cover comprises a transmission section corresponding to the imaging region of the imaging element, and an edge section that surrounds the transmission section outside the transmission section;
the edge section of the cover is selectively removed around a periphery of the edge section, thereby forming a frustum-shaped part whose cross-sectional area decreases monotonously from its exit side to its incidence side in the cover; and
an optical function region having an optical absorption, reflection, or scattering action is formed on an outer face of the frustum-shaped part.

(2) With the solid-state imaging device according to the first aspect of the present invention, as described above, the edge section of the transparent cover is selectively removed around the periphery of the edge section, thereby forming the frustum-shaped part whose cross-sectional area decreases monotonously from its exit side to its incidence side in the cover. The frustum-shaped part is usually like a frustum of a pyramid, such as a frustum of a quadrangular pyramid, it may be like a frustum of any other shape than a pyramid (for example, a frustum of a cone). Moreover, the optical function region having an optical absorption, reflection, or scattering action is formed on the outer face of the frustum-shaped part. For this reason, external light irradiated to the transmission section can reach the imaging region of the solid-state imaging element; however, external light irradiated to the edge section is absorbed, or reflected or scattered outward with respect to a central axis of the solid-state imaging device, by the optical function region located on the outer face of the frustum-shaped part. Therefore, arrival of the external light to the imaging region can be suppressed effectively. Accordingly, the image quality degradation due to the aforementioned causes (a) and (b) can be prevented.

In the case where a member such as a lens receiving member is located to surround this solid-state imaging device, external light reflected or scattered on the outer face of the frustum-shaped part may reach an inner face of the member. However, an optical absorption film is usually formed on the inner face of the member; therefore, this external light is absorbed by the optical absorption film and does not reach the imaging region.

Moreover, since the optical function region having an optical absorption, reflection, or scattering action is formed on the outer face of the frustum-shaped part, external light propagating in the transparent cover will be incident on the optical function region soon and subjected to the optical absorption, reflection, or scattering action of the optical function region. As a result, this light will be absorbed, reflected, or scattered by the optical function region in the same way as the external light irradiated to the edge section from the outside. When absorbed by the optical function region, it is apparent that image quality degradation due to this external light does not occur. When scattered by the optical function region, the intensity of light is largely lowered due to scattering and thus, image quality degradation due to this external light does not occur. When reflected by the optical function region, image quality degradation does not occur, if this external light is designed, for example, to go toward the outside of the imaging region by adjusting the shape of the outer face of the frustum-shaped part. In this way, the image quality degradation due to the aforementioned cause (c) can be prevented regardless of whether the function of the optical function region is absorption, reflection, or scattering.

(3) In a preferred embodiment of the solid-state imaging device according to the first aspect of the present invention, a curved, projecting part is formed at a position adjacent to a border with the transition section on the incidence side of the frustum-shaped part of the edge section. In this case, the projecting part may be provided around the whole edge section, or a curved, depressed part may be formed to be continuous to the projecting part by way of a transition part, in addition to the transition part.

In another preferred embodiment of the solid-state imaging device according to the first aspect of the present invention, a tapered part is formed at a position adjacent to a border with the transition section on the incidence side of the edge section.

In still another preferred embodiment of the solid-state imaging device according to the first aspect of the present invention, the optical function region is formed by an optical function film formed on the outer face of the frustum-shaped part. It is preferred that this optical function film is an optical reflection, absorption, or scattering film. It is usual that the optical reflection film is formed by a metal film. The optical absorption film is formed by, for example, an epoxy resin film into which carbon powder is dispersed.

In a further preferred embodiment of the solid-state imaging device according to the first aspect of the present invention, the optical function region is formed on the outer face of the frustum-shaped part by processing the same outer face. For example, minute lenses are formed on the outer face of the frustum-shaped part, or this outer face is roughened by a sandblasting method or a process using hydrofluoric acid.

(4) According to the second aspect of the present invention, another solid-state imaging device is provided, which comprises:

a solid-state imaging element having an imaging region; and a transparent cover covering a whole surface of the imaging region;

wherein the cover comprises a transmission section corresponding to the imaging region of the imaging element, and an edge section that surrounds the transmission section outside the transmission section; and an optical scattering region is formed on an outer face of the edge section of the cover.

(5) With the solid-state imaging device according to the second aspect of the present invention, as described above, the optical scattering region is formed on the edge section of the transparent cover and therefore, incident light irradiated to the transmission section of the cover reaches the imaging region of the solid-state imaging element. However, external light that has reached the edge section is scattered and thus, arrival of this external light to the imaging region can be suppressed effectively. Accordingly, the image quality degradation due to the aforementioned causes (a) and (b) can be prevented.

In the case where a member such as a lens receiving member is located to surround this solid-state imaging device, external light scattered by the optical scattering region may reach an inner face of the member. However, an optical absorption film is usually formed on the inner face of the member; therefore, this external light is absorbed by the optical absorption film and does not reach the imaging region.

Moreover, since the optical scattering region is formed on the edge section of the transparent cover, external light propagating in the cover will be incident on the optical scattering region soon and subjected to the optical scattering action of the optical scattering region. As a result, this light is scattered in the same way as the external light irradiated to the edge section from the outside. Since the intensity of the external light scattered by the optical scattering region is largely lowered, image quality degradation due to this external light does not occur. In this way, the image quality degradation due to the aforementioned cause (c) can be prevented.

The optical scattering region may be easily realized by roughening the surface of the edge section by, for example, a sandblasting method, a process using hydrofluoric acid, or formation of minute lenses.

(6) In a preferred embodiment of the solid-state imaging device according to the second aspect of the present invention, the optical scattering region is realized by minute lenses formed on a surface of the edge section.

In another preferred embodiment of the solid-state imaging device according to the second aspect of the present invention, the optical scattering region is realized by minute projections and depressions formed on a surface of the edge section.

(7) According to the third aspect of the present invention, a method of fabricating the solid-state imaging device according to the first aspect of the present invention is provided, which comprises the steps of:

preparing a semiconductor wafer on which solid-state imaging elements are formed;

joining a transparent plate for transparent covers to the wafer by way of a transparent insulating film in such a way as to cover all the imaging elements;

dicing the wafer to which the plate has been joined such that regions including the respective imaging elements are separated using a dicing blade, thereby dividing the wafer to result in imaging device sections whose surfaces are covered with transparent covers; and forming an optical function region having an optical absorption, reflection, or scattering action on the transparent cover of each of the imaging device sections, resulting in solid-state imaging devices;

wherein the cover of the solid-state imaging device comprises a transmission section corresponding to an imaging region of the imaging element, and an edge section that surrounds the transmission section outside the transmission section;

the edge section of the cover is selectively removed around a periphery of the edge section with the dicing blade having a predetermined profile in the step of dicing the wafer, thereby forming a frustum-shaped part whose cross-sectional area decreases monotonously from its exit side to its incidence side in the cover; and the optical function region is formed on an outer face of the frustum-shaped part.

(8) With the method of fabricating a solid-state imaging device according to the third aspect of the present invention, as described above, the edge section of the transparent cover is selectively removed around the periphery of the edge section with the dicing blade having a predetermined profile, thereby forming the frustum-shaped part whose cross-sectional area decreases monotonously from its exit side to its incidence side in the cover, in the step of dicing the semiconductor wafer to which the transparent plate for transparent covers has been joined. Therefore, with the method of fabricating a solid-state imaging device according to the third aspect of the present invention, the solid-state imaging device of the first aspect of the present invention can be fabricated.

Moreover, since the step of selectively removing the edge section of the cover to form the frustum-shaped part is carried out in the step of dicing the semiconductor wafer to which the transparent plate has been joined, it is unnecessary to perform the step of forming the frustum-shaped part separately. Thus, the fabrication steps are simplified.

In a preferred embodiment of the method of fabricating a solid-state imaging device according to the third aspect of the present invention, the dicing blade comprises a cutting portion for cutting the wafer and the insulating film, and a curved portion for forming the frustum-shaped part in the edge section of the cover by cutting the plate.

In another preferred embodiment of the method of fabricating a solid-state imaging device according to the third aspect of the present invention, a curved, projecting part is formed by the curved portion of the dicing blade at a position adjacent to a border with the transmission section on the incidence side of the frustum-shaped part of the edge section.

In still another preferred embodiment of the method of fabricating a solid-state imaging device according to the third aspect of the present invention, a tapered part is formed by the curved portion of the dicing blade at a position adjacent to a border with the transmission section on the incidence side of the edge section.

In a further preferred embodiment of the method of fabricating a solid-state imaging device according to the third aspect of the present invention, an optical function film is formed on the outer face of the frustum-shaped part as the optical function region. Preferably, this optical function film is an optical reflection, absorption, or scattering film. It is usual that the optical reflection film is formed by a metal film. The optical absorption film is formed by, for example, an epoxy resin film into which carbon powder is dispersed.

In a still further preferred embodiment of the method of fabricating a solid-state imaging device according to the third aspect of the present invention, the optical function region is formed on the outer face of the frustum-shaped part by processing the same outer face. For example, minute lenses are formed on the outer face of the frustum-shaped part, or this outer face is roughened by a sandblasting method or a process using hydrofluoric acid.

(10) According to the fourth aspect of the present invention, a camera module having a solid-state imaging device is provided, which comprises:

the aforementioned imaging device according to the first or second aspect of the present invention; and an imaging optical system that irradiates incident light to the imaging region of the imaging element by way of the transmission section of the cover.

(11) With the camera module according to the fourth aspect of the present invention, the aforementioned imaging device according to the first or second aspect of the present invention is provided and therefore, the image quality degradation due to the aforementioned causes (a) to (c) can be prevented with a simple structure.

Effects of the Invention

With the solid-state imaging devices according to the first and second aspects of the present invention, an advantage that the image quality degradation due to the aforementioned causes (a) to (c) can be prevented with a simple structure is obtained.

With the method of fabricating a solid-state imaging device according to the third aspect of the present invention, an advantage that the image quality degradation due to the aforementioned causes (a) to (c) can be prevented with simplified steps is obtained.

With the camera module according to the fifth aspect of the present invention, an advantage that the image quality degradation due to the aforementioned causes (a) to (c) can be prevented with a simple structure is obtained.

BRIEF DESCRIPTION OF THE DRAWINGS

FIG. 1 is a cross-sectional view along the line A-A in FIG. 2, which shows the schematic structure of a solid-state imaging device according to a first embodiment of the present invention.

FIG. 2 is a schematic external view of the surface side (incidence side of light) of the solid-state imaging device according to the first embodiment of the present invention.

FIG. 3 is a cross-sectional view showing the schematic structure of a camera module using the solid-state imaging device according to the first embodiment of the present invention.

FIG. 4 is a cross-sectional view showing the propagation state of light in the glass cover of the solid-state imaging device according to the first embodiment of the present invention.

FIG. 5 is a schematic plan view of a silicon wafer in which a plurality of imaging device sections for the solid-state imaging device according to the first embodiment of the present invention are formed.

FIG. 6 is a partial cross-sectional view showing a method of fabricating the solid-state imaging device according to the first embodiment of the present invention step by step.

FIG. 7 is a partial cross-sectional view showing the method of fabricating the solid-state imaging device according to the first embodiment of the present invention step by step, the step of which is subsequent to FIG. 6.

FIG. 8 is a partial cross-sectional view showing the method of fabricating the solid-state imaging device according to the first embodiment of the present invention step by step, the step of which is subsequent to FIG. 7.

FIG. 9 is a partial cross-sectional view showing the method of fabricating the solid-state imaging device according to the first embodiment of the present invention step by step, the step of which is subsequent to FIG. 8.

FIG. 10 is a partial cross-sectional view showing the method of fabricating the solid-state imaging device according to the first embodiment of the present invention step by step, the step of which is subsequent to FIG. 9.

FIG. 11 is a partial cross-sectional view showing the method of fabricating the solid-state imaging device according to the first embodiment of the present invention step by step, the step of which is subsequent to FIG. 10.

FIG. 12 is a partial cross-sectional view showing the method of fabricating the solid-state imaging device according to the first embodiment of the present invention step by step, the step of which is subsequent to FIG. 11.

FIG. 13 is a partial cross-sectional view showing the method of fabricating the solid-state imaging device according to the first embodiment of the present invention step by step, the step of which is subsequent to FIG. 12.

FIG. 14 is a partial cross-sectional view showing the method of fabricating the solid-state imaging device according to the first embodiment of the present invention step by step, the step of which is subsequent to FIG. 13.

FIG. 15 is a partial cross-sectional view showing the method of fabricating the solid-state imaging device according to the first embodiment of the present invention step by step, the step of which is subsequent to FIG. 14.

FIG. 16 is a partial cross-sectional view showing the method of fabricating the solid-state imaging device according to the first embodiment of the present invention step by step, the step of which is subsequent to FIG. 15.

FIG. 17 is a partial cross-sectional view showing the method of fabricating the solid-state imaging device according to the first embodiment of the present invention step by step, the step of which is subsequent to FIG. 16.

FIG. 18 is a partial cross-sectional view showing the method of fabricating the solid-state imaging device according to the first embodiment of the present invention step by step, the step of which is subsequent to FIG. 17.

FIG. 19 is a cross-sectional view showing the schematic structure of a camera module using a solid-state imaging device according to a second embodiment of the present invention.

FIG. 20 is a partial cross-sectional view showing a method of fabricating the solid-state imaging device according to the second embodiment of the present invention step by step, which corresponds to the state of FIG. 17.

FIG. 21 is a partial cross-sectional view showing the method of fabricating the solid-state imaging device according to the second embodiment of the present invention step by step, the step of which is subsequent to FIG. 20.

FIG. 22 is a cross-sectional view showing the schematic structure of a solid-state imaging device according to a third embodiment of the present invention.

FIG. 23 is an enlarged, partial view of the glass cover of the solid-state imaging device according to the third embodiment of the present invention.

FIG. 24 is a cross-sectional view showing the schematic structure of a solid-state imaging device according to a fourth embodiment of the present invention.

FIG. 25 is an enlarged, partial view of the glass cover of the solid-state imaging device according to the fourth embodiment of the present invention.

FIG. 26 is a cross-sectional view showing a first variation of the solid-state imaging device according to the first embodiment of the present invention.

FIG. 27 is a cross-sectional view showing a second variation of the solid-state imaging device according to the first embodiment of the present invention.

FIG. 28 is a cross-sectional view showing a third variation of the solid-state imaging device according to the first embodiment of the present invention.

FIG. 29 is a cross-sectional view showing a fourth variation of the solid-state imaging device according to the first embodiment of the present invention.

FIG. 30 is a cross-sectional view showing a fifth variation of the solid-state imaging device according to the first embodiment of the present invention.

FIG. 31 is a cross-sectional view showing a sixth variation of the solid-state imaging device according to the first embodiment of the present invention.

FIG. 32 is a cross-sectional view showing the schematic structure of a solid-state imaging device according to a fifth embodiment of the present invention.

DESCRIPTION OF THE REFERENCE SYMBOLS 1, 1A, 1B, 1C: solid-state imaging device
10: solid-state imaging element
11: silicon substrate
12: interlayer insulting film
13: conductive plug
14: conductive plug
15: surface electrode
16a, 16b: insulating film
17: solder resist
18: wiring film
19: conductive contact
20: copper paste
21: solder ball (external electrode)
22: microlens
22A: microlens array
23: light-receiving region
24: micro filter
25: imaging surface
26: imaging region
31: through hole
32: through hole
50: SOG material film
60, 60A, 60B, 60C: glass cover
60a, 60Aa, 60Ba, 60Ca: transmission section
60b, 60Ab, 60Bb, 60Cb: edge section
60b1, 60Ab1: projecting part
60b2: depressed part
60b3: transition part
60Cb1: tapered part
61: glass plate
62B: minute lens
62C: minute projection and depression
63, 63A: optical function film
63-1, 63-2, 63-3, 63-4, 63-5, 63-6: optical function film
63B, 63C: optical scattering region
65: imaging device section
70: silicon wafer
71: scribe line
80: bonding surface
81: handling holder
82: sticky agent
83, 83A: dicing blade
83a, 83Aa: cutting portion
83b, 83Ab: curved portion
90: collecting lens
91: lens receiving member
92: PWB
PX: pixel
AX: central axis of solid-state imaging device

BEST MODE FOR CARRYING OUT THE INVENTION

Preferred embodiments of the present invention will be described below in detail while referring to the drawings attached.

First Embodiment

FIGS. 1 and 2 show a solid-state imaging device 1 according to a first embodiment of the present invention, where FIG. 1 is a cross-sectional view along the line A-A in FIG. 2, which shows the schematic structure of the device 1, and FIG. 2 is a schematic external view of the surface side (incidence side of light) of the device 1. An optical function film 63 is omitted in FIG. 2.

Structure of Solid-State Imaging Device

As shown in FIG. 1, the solid-state imaging device 1 is constituted by sealing a chip-shaped solid-state imaging element 10 in a Chip-Size Package (CSP) that includes a transparent glass cover 60. This device 1 does not have a cavity between the imaging surface 25 of the solid-state imaging element 10 and the glass cover 60; however, the device 1 may have such a cavity.

The solid-state imaging device 1 comprises a silicon substrate 11, on the surface of which light-receiving elements (not shown) and light-receiving regions 23 are formed. The light-receiving elements and the light-receiving regions 23 are formed for pixels PX in a one-to-one relationship. A transparent interlayer insulating film 12 is formed on the substrate 11 in such a way as to cover its whole surface. The surface of the interlayer insulating film 12 constitutes the imaging surface 25 of the solid-state imaging element 10, on which microlenses 22 arranged in an array, i.e., a microlens array 22A, is formed. The microlenses 22 are formed for the pixels PX in a one-to-one relationship on the imaging surface 25. Each light-receiving region 23 is located in such a way as to be superposed on a corresponding one of the microlenses 22 by way of the film 12. Micro filters (color filters) 24 for three colors, R (red), G (green), and B (blue) (or, for four colors including black in addition to R, G, and B) are formed near each of the microlenses 22.

As shown in FIGS. 1 and 2, the solid-state imaging element 10 comprises a rectangular (here, a square) imaging region 26 formed on the imaging surface 25, where the region 26 includes the microlens array 22A. Light that has reached the inside of the solid-state imaging device 1 by way of the glass cover 60 is designed to be irradiated to the inside of the imaging region 26. This incident light is irradiated to the respective light-receiving regions 23 by way of the corresponding microlenses 22 and converted to electric signals with respect to the respective pixels PX, thereby picking up an image of an object.

On the surface of the interlayer insulating film 12, surface electrodes 15 are formed in the outer region of the microlens array 22A (in the peripheral region of the imaging region 26). The surface electrodes 15 are provided for leading the electric signals generated by the respective light-receiving elements to the outside of the solid-state imaging device 1. The surface electrodes 15 are electrically connected to the respective light-receiving elements (the respective light-receiving regions 23) by way of leading lines (not shown) formed on the surface of the substrate 11 and those formed in the interlayer insulating film 12.

As seen from FIG. 1, projections and depressions caused by the microlenses 22 and the surface electrodes 15 exist on the imaging surface 25 (in the imaging region 26).

In reality, the interlayer insulating film 12 is constituted by a plurality of insulating films stacked; however, the internal structure of the film 12 is not important for the present invention and thus, it is simplified and illustrated in FIG. 1.

A transparent SOG (Spin on Glass) material film 50 is formed on the surface of the interlayer insulating film 12, which covers the whole surface of the film 12. Since the thickness of the SOG material film 50 is greater than the thickness of the microlenses 22 and that of the surface electrodes 15, the microlens array 22A and the surface electrodes 15 are embedded in the SOG material film 50. Therefore, the surface of the film 50 is flat.

The glass cover 60 is formed on the surface of the SOG material film 50. Here, the glass cover 60, which is constituted by a transparent borosilicate glass ($B_2O_3/SiO_2$) plate, is joined to the surface of the film 50 to be united with the chip-shaped solid-state imaging element 10.

Further, the side faces of the stack formed by the solid-state imaging element 10, the SOG material film 50, and the glass cover 60 are entirely covered with an insulting synthetic resin (not shown) that constitutes a part of the CSP. However, these side faces may not be covered with an insulting synthetic resin.

In the inside of the interlayer insulating film 12, through holes that penetrate through this film 12 are formed at the positions directly below the respective surface electrodes 15. These holes are filled with conductive plugs 14. In the inside of the silicon substrate 11 also, through holes that penetrate vertically through this substrate 11 are formed at the positions directly below the respective surface electrodes 15. These holes are filled with conductive plugs 13. The entire side face of each plug 13 is covered with an insulating film 16a formed on the inner wall of the corresponding hole. Thus, each plug 13 and the substrate 11 are electrically insulated from each other by the corresponding insulating film 16a. The top and bottom ends of each plug 14 are in contact with the surface electrode 15 located directly above this plug 14 and the plug 13 located directly below this plug 14, respectively. The bottom end of each plug 13 is exposed from the back of the substrate 11. The plugs 14 and 13 thus contacted with each other constitute a penetrating electrode that effects an electrical interconnection through the substrate 1 between the surface electrode 15 located on the surface of the interlayer insulating film 12 on the substrate 1 and a wiring film 18 located on the back of the substrate 1.

An insulating film 16b is formed on the back of the silicon substrate 11, covering the area of the back excluding the exposed bottoms of the plugs 13. On the surface of the film 16b, the wiring films 18 that have been patterned to have predetermined shapes are formed. Each wiring film 18 is in contacted with the bottom end of a corresponding one of the conductive plugs 13 exposed from the back of the substrate 11.

A solder resist 17 is formed on the surface of the insulating film 16b so as to cover the wiring films 18. Through holes are formed in the solder resist 27 at the positions superposed on the respective wiring films 18. The insides of these holes are filled with conducive contacts 19.

Copper pastes 20 that have been patterned to have predetermined shapes are formed on the surface of the solder resist 17 at the positions superposed on the respective conductive contacts 19. Solder balls 21 serving as external electrodes are formed on the respective copper pastes 20.

In this way, each surface electrode 15 is electrically connected to the corresponding cupper paste 20 and solder ball located on the back (the lower surface in FIG. 1) of the solid-state imaging device 1 by way of the corresponding conductive plugs 14 and 13, and the corresponding wiring film 18 and conductive contact 19.

External light enters the inside of the solid-state imaging device 1 through the glass cover 60, and passes through the SOG film 50, the microlenses 22, and the micro filters 24, thereby incident on the light-receiving regions 23 of the light-receiving elements (not shown) provided in the respective pixels PX. Then, this incident light is photoelectrically converted in the light-receiving regions 23, generating electric signals in accordance with the intensity of the incident light in the respective pixels PX. These electric signals are amplified by amplifier elements (not shown) provided adjacent to the light-receiving regions 23 in the respective pixels PX and thereafter, sent to the surface electrodes 15 by way of the unillustrated leading lines. Furthermore, these electric signals are led to the corresponding copper pastes 20 and solder balls 21 by way of the conductive plugs 14 electrically connected to the surface electrodes 15, the conductive plugs 13, the wiring films 18, and the conductive contacts 19.

As seen from FIGS. 1 and 2, the glass cover 60 has a transmission section 60a corresponding to the imaging region 26 formed in the central part of the cover 60, and an edge section 60b is formed to surround the transmission section 60a. The transmission section 60a has a rectangular plan shape approximately equal to that of the imaging region 26. The edge section 60b has a rectangular ring-like plan shape, which is larger than that of the transmission section 60a. The transmission section 60a serves as an optical guiding part for allowing the light that has been irradiated to the transmission section 60a to pass through the same section, thereby leading this light to the imaging region 26. The edge section 60b does not conduct such an optical guiding action as the transmission section 60a.

The structure of the transmission section 60a is the same as that of conventional solid-state imaging devices of this type that have been known so far. However, unlike the known structure of these conventional known solid-state imaging devices, a part of the edge section 60b is selectively removed and as a result, the edge section 60b has a shape like a frustum of a pyramid whose bottom is rectangular as a whole. Accordingly, the cross-sectional shape of the cover 60 is approximately trapezoidal, as shown in FIG. 1, where the side of the trapezoid positioned at the entrance of the cover 60 (upper side) is shorter than the side thereof positioned at the exit of the cover 60 (lower side). The structure of the cover 60 is different from the known structure of the conventional solid-state imaging devices of this type at this point. As shown in FIG. 2, both of the plan shapes of the cover 60 at its incidence and exit sides are rectangular.

On the incidence side of the edge section 60b, a projecting part 60b1 is formed to be adjacent to the border with the transition section 60a, where the surface of the projecting part 60b1 is curved to project. The plan shape of the projecting part 60b1 is like a rectangular ring. On the exit side of the projecting part 60b1, a transition part 60b3 is formed to be adjacent to the projecting part 60b1. The plan shape of the transition part 60b3 is like a rectangular ring. On the exit side of the transition part 60b3, a depressed part 60b2 is formed to be adjacent to the transition part 60b3, where the surface of the depressed part 60b2 is curved to be depressed. The plan shape of the depressed part 60b2 is like a rectangular ring. The surface curvature is changed from projecting curvature to depressed one at the transition part 60b3. As a result, as shown in FIG. 1, the width (the area) of the surface of the edge section 60b becomes larger gradually from the incidence-side end of the cover 60 toward the exit side thereof in such a way as to be curved to form an S character and thereafter, it accords with the width (area) of the SOG material film 50 at the position slightly before the exit-side end of the cover 60. The cover 60 has the same cross section as that of FIG. 1 on the cross section along the line B-B in FIG. 2 also, where the line B-B is perpendicular to the line A-A shown in FIG. 1.

On the outer surface (outer side faces) of the edge section 60b where the part of the section 60b has been selectively removed, that is, on the outer surfaces (outer side faces) of the projecting part 60b1, the transition part 60b3, and the depressed part 60b2, an optical function film 63 is formed. Therefore, the outer surface (outer side faces) of the edge section 60b is covered with the film 63.

The optical function film 63 is a film having an optical reflection or optical absorption function, where the film 63 not only reflects or absorbs the light irradiated from the outside of the cover 60 but reflects or absorbs the light irradiated from the inside of the cover 60. This is because the film 63 is in close contact with the outer surface of the edge section 60b.

The optical function film 63 with an optical reflection function may be formed by, for example, a metal film such as an aluminum film. However, the present invention is not limited to this. Any other film may be used if it has an optical reflection function.

The optical function film 63 with an optical absorption function may be formed by, for example, a coated film of en epoxy resin into which carbon powder has been dispersed. Any other film may be used if it has an optical absorption function.

In addition, the aforementioned solid-state imaging device 10 includes the microlens array 22A formed on the imaging surface 25; however, it does not need to include the microlens array 22A. Moreover, the aforementioned device 10 includes the micro filters 24; however, it does not need to include the micro filters 24.

Fabrication Method of Solid-State Imaging Device

Next, a fabrication method of the solid-state imaging device 1 having the aforementioned structure will be explained with reference to FIGS. 6 to 18.

All the process steps of the fabrication method to be explained below are carried out on the wafer level. In the final step of these wafer processes, a plurality of imaging device sections 65 arranged in a matrix array on a silicon wafer 70 is formed simultaneously, as shown in FIG. 5. Each of the imaging device sections 65 is a region in which the solid-state imaging device 10 having the aforementioned structure is formed. Thereafter, dicing is performed for the silicon wafer 70 along scribe lines 71 established like a go board, thereby separating the imaging device sections 65 from each other. In this way, the solid-state imaging devices 1 having the structure shown in FIGS. 1 and 2 are fabricated.

First of all, the imaging device sections 65 each having the structure shown in FIG. 6 are formed on the silicon wafer 70 by a known method. These imaging device sections 65 have been subjected to predetermined tests and confirmed good. To simplify the drawing, only one of the sections 65 is shown in FIG. 6. However, actually, a plurality of the sections 65 is arranged in a matrix array on the silicon wafer 70.

Next, as shown in FIG. 7, the SOG material film 50 is formed on the surface of the silicon wafer 70, correctly speaking, on the surface of the interlayer insulating film 12 (on the imaging surface 25). This step is carried out by coating a SOG material by the spin coating method (the spraying method may be used instead) in the atmosphere at room temperature. In this way, a coated film of the SOG material is formed. This coated film is designed to have a thickness that makes it possible to embed the micro lens array 22A and all the surface electrodes 15. At this time, the surface of the SOG material film 50 is extremely flat (for example, the surface has undulations of 0.1 μm or less). Subsequently, the coated film of this SOG material is heated and cured, resulting in the transparent SOG material film 50.

Next, a borosilicate glass plate 61 (which has the same shape and the same size as those of the silicon wafer 70) is joined to the surface of the SOG material film 50 using, for example, an anodic bonding apparatus, as shown in FIG. 8. At this time, the joint of the surface of the film 50 and the surface of the plate 61 forms a bonding surface 80.

After the joining of the glass plate 61 for the glass covers 60 is completed in this way, the stack formed by the silicon wafer 70, the SOG material film 50, and the glass plate 61 is attached to a handling holder 81 using a sticky agent 82, as shown in FIG. 9. The surface of the glass plate 61 is set as the face on which the sticky agent 82 is coated. This is to facilitate the processing (treatment) of the wafer 70 to be carried out next. The holder 81 is slightly larger than the wafer 70.

Then, to thin the whole silicon wafer 70, the silicon substrate 11 is removed from its back side until the substrate 11 has a predetermined thickness (e.g., 100 μm to 50 μm). This step may be carried out by CMP (Chemical Mechanical Polishing) or known dry or wet etching. Mechanical polishing may be used in combination with it.

Subsequently, the silicon wafer 70 thus thinned is selectively etched from its back side using a patterned photoresist film as a mask, thereby forming through holes 31 penetrating through the wafer 70, as shown in FIG. 10. The top ends of the holes 31 extend to the back of the interlayer insulating film 12. The positions where these holes 31 are formed are directly below the respective surface electrodes 15. This step may be carried out by etching such as RIE (Reactive Ion Etching), ICE (Inductively Coupled Etching) and the like. However, it may be carried out by laser beam machining, anodic oxidation, or the like.

Then, using the same resist film, the silicon wafer 70 is selectively etched again from its back side, thereby forming through holes 32 that penetrate through the interlayer insulating film 12, as shown in FIG. 11. The top ends of the holes 32 extend to the back of the surface electrodes 15. The positions where these holes 32 are formed are directly below the respective surface electrodes 15 and are superposed on the respective holes 31. This step may be carried out by etching such as RIE, ICE and the like; however, it may be carried out by laser beam machining, anodic oxidation, or the like. Each of the holes 32 communicates with a corresponding one of the holes 31.

Then, the silicon wafer 70 is oxidized thermally, forming a silicon dioxide ($SiO_2$) film serving as the insulating films 16a and 16b on the exposed faces of the wafer 70, as shown in FIG. 12. The insulating films 16a cover the inner walls of the holes 31. The insulating film 16b covers the entire back of the wafer 70 except for the areas where the holes 31 are formed.

Next, the insides of the holes 31 and 32 are filled with polysilicon, thereby forming the conductive plugs 13 and 14, as shown in FIG. 13. This step may be carried out by depositing a polysilicon on the back of the silicon wafer 70 by CVD (Chemical Vapor Deposition) and by etching back the polysilicon thus deposited. This polysilicon needs to have a deposition thickness such that the holes 31 and 32 are filled with the polysilicon.

Following this, the patterned wiring films 18 are formed on the surface of the insulating film 16b, as shown in FIG. 14. Each of the wiring films 18 is in contact with a corresponding one of the plugs 13. This step may be carried out by selectively forming a metal film by sputtering, plating, pasting, or the like.

Thereafter, the solder resist 17 is formed on the surface of the insulating film 16b, covering the wiring films 18. Through holes are formed in the solder resist 17 at predetermined positions and then, a conductive material is embedded in these holes, forming the conductive contacts 19. Each contact 19 is in contact with the corresponding wiring film 18. The surface of the solder resist 17 is planarized. The state at this time is shown in FIG. 14.

Next, the patterned copper pastes 20 are formed on the surface of the solder resist 17, as shown in FIG. 15. Each paste 20 is in contact with the corresponding conductive contact 19. Subsequently, the solder balls 21 are formed on the respective pastes 20.

The imaging device sections 65 are formed on the silicon wafer 70 in this way and thereafter, the wafer 70 is subject to dicing along the scribe lines 71 established like a go board using a dicing blade 83 with a profile shown in FIG. 16. This dicing blade 83, the shape of which is like a circular plate, is structured in such a way as to be attachable to the rotation shaft of a known dicing apparatus (dicer) and rotatable at predetermined speed. The blade 83 has a cutting portion 83a at its end and a curved portion 83b formed next to the cutting portion 83a. The cutting portion 83a, which is a part for cutting the silicon wafer 70 and separating the same, has a sharp edge. The curved portion 83b, which is a part for cutting the glass plate 61, has a curved surface at its each side in conformity with the outer shape of the edge section 60b of the cover 60 shown in FIG. 1. In addition, in order that the imaging device sections 65 are not dispersed after cutting, a known dicing tape (not shown) is stuck to the back of the silicon wafer 70.

The dicing blade 83 with the shape of FIG. 16 is assigned to one of the scribe lines 71 and rotated at a predetermined speed. Then, the blade 83 is moved along the scribe line 71 thus assigned under application of a pressure in a state where the cutting portion 83a of the blade 83 is in contact with the glass plate 61. By repeating this motion, the glass plate 61, the SOG material film 50, and the silicon wafer 70 in which the solid-state imaging devices 10 have been formed are removed along the scribe line 71 thus assigned, resulting in the state shown in FIG. 17. In this state, the wafer 70 is cut off and at the same time, curved surfaces that will form the edge sections 60b shown in FIG. 1 are formed on the glass plate 61 at each side of the assigned line 71. In the state of FIG. 17, the imaging device sections 65 are separated from each other; however, these sections 65 are kept as one by the dicing tape stuck to the back of the wafer 70.

After the cutting operations along the remaining scribe lines 71 parallel to the scribe line 71 of FIG. 17 are completed, similar cutting operations are carried out along the scribe lines 71 perpendicular to the aforementioned scribe lines 71. When the cutting operations along all the scribe lines 71 extending like a go board shown in FIG. 5 are completed in this way, the silicon wafer 70 is cut off along the respective scribe lines 71. As a result, the imaging device sections 65 on the wafer 70 are separated from each other, as shown in FIG. 18.

Following this, the optical function film 63 is selectively formed on the outer side face of the edge section 60b of each imaging device section 65. After covering the unnecessary part of this outer side face with an appropriate masking film, the optical function film 63 is formed on the same outer side face and then, the masking film is removed. The film 63 can be easily formed in this way. Alternately, a source material of the optical function film 63 may be selectively coated on a desired area and then, cured.

Through the aforementioned steps, a plurality of the solid-state imaging devices 1 with the structure of FIG. 1 is obtained simultaneously. With each of the devices 1 thus obtained, the edge section 60b of the glass cover 60 has the projecting part 60b1, the depressed part 60b2, and the transition part 60b3 shown in FIGS. 1 and 2. Therefore, any other machining is unnecessary for forming the edge section 60b whose shape is like a frustum of a rectangular pyramid on the glass cover 60; as a result, the increase in fabrication cost can be avoided.

If it is unnecessary that all the side faces of the solid-state imaging device 1 are covered with an insulating synthetic resin (not shown) that forms a part of the CSP, the fabrication process sequence is completed at this stage. If it is necessary that all the side faces of the solid-state imaging device 1 are covered with an insulating synthetic resin (not shown) that form a part of the CSP, these side faces are covered with the insulating synthetic resin and thereafter, the fabrication process sequence is completed.

Example of Usage of Solid-State Imaging Device

The solid-state imaging device 1 with the structure of FIGS. 1 and 2 is used as, for example, a camera module for a high image quality digital camera, as shown in FIG. 3. This camera module comprises the solid-state imaging device 10, a collecting lens 90 located apart from the glass cover 60 of the device 1 at a predetermined distance, and a lens receiving member 91 for receiving the lens 90. The lens 90 is fixed to the inside of the member 91, constituting an imaging optical system. The imaging device 1 is mounted on a PWB (Printed Wiring Board) 92 using the solder balls 21.

Rays of incoming light through the opening of the lens receiving member 91 propagate along the paths shown in FIG. 3. Specifically, the ray L1 of the incoming light that is incident on the neighborhood of the central axis of the collecting lens 90 (the central axis AX of the solid-state imaging device 1) goes approximately straight to penetrate through the lens 90 and then, is irradiated to the transmission section 60a of the glass cover 60 and therefore, the ray L1 can be incident on the imaging region 26 by way of the transmission section 60a. The ray L2 of the incoming light that is incident on an approximately intermediate region between the central axis and the edge of the collecting lens 90 is slightly bent toward the central axis X by the lens 90 and then, irradiated to the transmission section 60a; therefore, the ray L2 also can be incident on the imaging region 26 by way of the transmission section 60a. The ray L3 of the incoming light that is incident on a position shifted toward the edge of the lens 90 compared with the ray L2 is largely bent toward the central axis X by the lens 90 and then, irradiated to the transmission section 60a; therefore, the ray L3 also can be incident on the imaging region 26 by way of the transmission section 60a. This is because this module is designed such that only the external light that will be incident directly (without reflection at other positions) on the imaging region 26 through the lens 90 and the cover 60 (directly incident light) reaches the imaging region 26 by the lens receiving member 91.

However, external light passing through the collecting lens 90 may reach the edge section 60b of the glass cover 60 due to dimension errors during fabrication and/or placement errors during assembly. Such the external light as described here will enter the inside of the cover 60 by way of the edge section 60b to reach the imaging region 26 and therefore, it will be a cause for image quality degradation. However, the outer side face of the edge section 60b is removed and curved, as shown in FIGS. 1 and 2, forming the projecting part 60b1, the depressed part 60b2, and the transition part 60b3. Moreover, the outer side face of the edge section 60b is covered with the optical function film 63. Accordingly, the ray L4 of the incoming light that reaches the edge section 60b is usually incident on the surface of the optical function film 63 at the projecting part 60b1 which is nearest to the transmission section 60a.

If the optical function film 63 has an optical reflection function, in other words, if the film 63 is an optical reflecting film, the ray L4 is reflected outward from the central axis AX, reaching the inner face of the lens receiving member 91. Since an optical absorption film (not shown) is formed on the inner face of the member 91 to prevent optical reflection thereon, the ray L4 reflected by the optical function film 63 is absorbed by the optical absorption film. Accordingly, the ray L4 generated by the aforementioned cause (a) will not degrade the image quality.

Moreover, a part of external light that reaches the transition section 60a of the glass cover 60 may be reflected by the surface of the section 60a and then, the external light thus reflected may be further reflected toward the cover 60 by the collecting lens 90 to reach the edge section 60b of the cover 60. When the ray L5 of the light that has reached the edge section 60b in this way is incident on the surface of the optical function film 63 at the transition part 60b3 also, the ray L5 is reflected obliquely toward the outside from the central axis AX and absorbed by the optical absorption film on the inner face of the lens receiving member 91. Accordingly, the ray L5 generated by the aforementioned cause (b) will not degrade the image quality. Similarly, when the ray L6 of the light that has reached the edge section 60b through the collecting lens 90 is incident on the surface of the optical function film 63 at the depressed part 60b2 also, the ray L6 is reflected outward from the central axis AX and absorbed by the optical absorption film on the inner face of the member 91. Accordingly, the ray L6 generated by the aforementioned cause (b) will not degrade the image quality also.

If the optical function film 63 has an optical absorption function, in other words, if the film 63 is an optical absorbing film, the rays of the light that have reached the film 63 are absorbed by the film 63 itself; therefore, it is apparent that the rays L4, L5, or L6 will not degrade the image quality.

Furthermore, external light that has entered the inside of the glass cover 60 propagates, for example, as shown in FIG. 4. Specifically, in FIG. 4, the ray La of the light that has entered the inside of the transmission section 60a of the glass cover 60 through its incident end face is reflected by the exit end face of the cover 60 and thereafter, is incident on the inner face of the optical function film 63 at the projecting part 60b1. As a result, when the film 63 has an optical reflection function, the ray La is reflected by the film 63 and sent to the outside of the imaging region 26 and therefore, the ray La will not affect the image quality. When the film 63 has an optical absorption function, the ray La is absorbed by the film 63 and therefore, the ray La will not affect the image quality as well.

The ray Lb of light that has entered the inside of the transmission section 60a of the glass cover 60 through its incident end face is reflected repeatedly between the incident and exit end faces of the cover 60 and thereafter, is incident on the inner face of the optical function film 63 at the transition part 60b3. As a result, when the film 63 has an optical reflection function, the ray Lb is reflected by the film 63 toward the incident end face and sent to the outside of the imaging region 26 and therefore, the ray Lb also will not affect the image quality. When the film 63 has an optical absorption function, the ray Lb is absorbed by the film 63 and therefore, the ray Lb will not affect the image quality as well.

The ray Lc of light that has entered the inside of the transmission section 60a of the glass cover 60 through its incident end face is reflected repeatedly between the incident and exit end faces of the cover 60 and thereafter, is incident on the inner face of the optical function film 63 at the depressed part 60b2. Accordingly, when the film 63 has an optical reflection function, the ray Lc is reflected by the film 63 and sent to the imaging region 26, resulting in a possibility that the ray Lc affects the image quality. However, the amount of the ray Lc is small. Therefore, even if a possible effect by the ray Lc exists, it is suppressed at a ignorable level. When the film 63 has an optical absorption function, the ray Lc is absorbed by the film 63 and therefore, the ray Lc will not affect the image quality.

The ray Ld of light that has been incident on the incident end face of the glass cover 60 in the transmission section 60a thereof is reflected by this incident end face; however, a part of the ray Ld enters the inside of the cover 60 and is sent to the imaging region 26. Therefore, there is a possibility that the ray Ld affects the image quality. However, the amount of the ray Ld is small. Therefore, even if a possible effect by the ray Ld exists, it is suppressed at a ignorable level.

The ray Le of light that has entered the inside of the transmission section 60a of the glass cover 60 through its incident end face in the close vicinity of the border with the edge section 60b is reflected by the exit end face of the cover 60 and thereafter, is incident on the inner face of the optical function film 63 at the depressed part 60b2. As a result, when the film 63 has an optical reflection function, the ray Le is reflected by the film 63 and sent to the outside of the imaging region 26. Thus, the ray Le will not affect the image quality. When the film 63 has an optical absorption function, the ray Le is absorbed by the film 63 and therefore, the ray Le will not affect the image quality.

There are rays of light that propagate through the glass cover 60 in different manners from those of the rays La, Lb, Lc, Ld, and Le. However, considerable parts of these rays are reflected by the optical function film 63 and sent to the outside of the imaging region 26 in similar manners to those of the rays La, Lb, Lc, Ld, and Le. Thus, even if the film 63 has an optical reflection function, possible effects of these rays to the image quality are suppressed at ignorable levels.

Accordingly, to say nothing of the case where the optical function film 63 has an optical absorption function, even if the film 63 has an optical reflection function, the image quality will not degrade due to the aforementioned cause (c).

With the solid-state imaging device 1 according to the first embodiment of the present invention, as explained above in detail, the image quality degradation due to the aforementioned causes (a) to (c) can be prevented with a simple structure. Similarly, with the camera module according to the first embodiment of the present invention also, the image quality degradation due to the aforementioned causes (a) to (c) can be prevented with a simple structure.

In addition, in the solid-state imaging device 1 according to the first embodiment of the present invention, the structure of the solid-state imaging element 10 shown in FIGS. 1 and 2 is an exemplary example, and the element 10 may have any other structure than that of FIG. 1. Moreover, an optical scattering region may be formed instead of the optical function film 63. Such optical scattering region may be formed by, for example, roughening the outer side face of the edge section 60b, as shown in third and fourth embodiments of the present invention explained later.

Second Embodiment

FIG. 19 is a cross-sectional view showing the schematic structure of a solid-state imaging device 1A according to a second embodiment of the present invention and a camera module using the device 1A.

Structure of Solid-State Imaging Device

Since the solid-state imaging device 1A according to this embodiment has the same structure as the aforementioned solid-state imaging device 1 according to the first embodiment except for an edge section 60Ab of a glass cover 60A, the explanation about the same structure is omitted here by attaching the same reference symbols as used in the device 1 of the first embodiment.

Similar to the edge section 60b of the imaging device 1 of the first embodiment, a part of the edge section 60Ab of the glass cover 60A of the solid-state imaging device 1A is selectively removed and as a result, the edge section 60Ab has a shape like a frustum of a pyramid whose bottom is rectangular as a whole. Accordingly, as shown in FIG. 19, the Cross sectional shape of the cover 60A is approximately trapezoidal, where the side of the trapezoid positioned at the entrance of the cover 60A (upper side) is shorter than the side thereof positioned at the exit of the cover 60A (lower side). Both of the plan shapes of the cover 60A at its incidence and exit sides are rectangular.

On the incidence side of the edge section 60Ab, a projecting part 60Ab1 is formed to be adjacent to the border with the transition section 60Aa, where the surface of the projecting part 60Ab1 is curved to project. The plan shape of the projecting part 60Ab1 is like a rectangular ring. On the exit side of the projecting part 60Ab1, the transition part 60b3 and the depressed part 60b2 used in the first embodiment are not provided. As shown in FIG. 19, the width (area) of the surface of the edge section 60Ab becomes larger gradually from the incidence-side end of the cover 60A toward the exit side thereof in such a way as to be curved to form an arc and thereafter, it accords with the width (area) of the SOG material film 50 at the position slightly before the exit-side end. The glass cover 60A has the same cross section as that of FIG. 17 on the cross section along the line B-B also, where the cross section along the line B-B is perpendicular to that along the line A-A.

On the outer surface (outer side faces) of the edge section 60Ab where the part of the section 60Ab has been selectively removed, that is, on the outer surfaces (outer side faces) of the projecting part 60Ab1, an optical function film 63A is formed. Therefore, the outer side faces of the edge section 60Ab are covered with the film 63A.

The optical function film 63A is a film having an optical reflection or optical absorption function similar to the optical function film 63 in the first embodiment, where the film 63A not only reflects or absorbs light irradiated from the outside of the glass cover 60A but reflects or absorbs light irradiated from the inside of the cover 60A. This is because the film 63A is in close contact with the outer surface of the edge section 60Ab.

In this way, with the present invention, only the projecting part 60Ab1 whose surface is curved convexly to be adjacent to the border with the transition section 60Aa may be formed on the incidence side of the edge section 60Ab.

Fabrication Method of Solid-State Imaging Device

Next, a fabrication method of the solid-state imaging device 1A having the aforementioned structure will be explained with reference to FIG. 20. FIG. 20 corresponds to the state of FIG. 17 in the first embodiment.

After the imaging device sections 65 are formed on the silicon wafer 70 in the same way as the first embodiment, the wafer 70 is subject to dicing along the scribe lines 71 established like a go board using a dicing blade 83A with a profile shown in FIG. 20. This dicing blade 83A has a cutting portion 83Aa at its end and a curved portion 83Ab formed next to the cutting portion 83Aa. The cutting portion 83Aa, which is a part for cutting the silicon wafer 70 and separating the same, has a sharp edge. The curved portion 83Ab, which is a part for cutting the glass plate 61, has a curved surface in conformity with the outer shape of the edge section 60Ab of FIG. 19 at each side thereof.

The dicing blade 83A with the shape of FIG. 20 is assigned to one of the scribe lines 71 and rotated at a predetermined speed. Then, the blade 83A is moved along the scribe line 71 thus assigned under application of a pressure in a state where the cutting portion 83Aa of the blade 83A is in contact with the glass plate 61. By repeating this motion, the glass plate 61, the SOG material film 50, and the silicon wafer 70 in which the solid-state imaging devices 10 have been formed are removed along the scribe line 71 thus assigned, resulting in the state shown in FIG. 20. In this state, the wafer 70 is cut off and at the same time, curved surfaces that will form the edge sections 60Ab shown in FIG. 19 are formed on the glass plate 61 at each side of the assigned line 71. In the state of FIG. 20, the imaging device sections 65 are separated from each other; however, these sections 65 are kept as one by the dicing tape (not shown) stuck to the back of the wafer 70.

After the cutting operations along the remaining scribe lines 71 parallel to the scribe line 71 of FIG. 20 are completed, similar cutting operations are carried out along the scribe lines 71 perpendicular to the aforementioned scribe lines 71. When the cutting operations along all the scribe lines 71 extending like a go board shown in FIG. 4 are completed in this way, the silicon wafer 70 is cut along the respective scribe lines 71. As a result, the imaging device sections 65 on the wafer 70 are separated from each other, as shown in FIG. 21.

Following this, the optical function film 63A is selectively formed on the outer side face of the edge section 60Ab of each imaging device section 65.

Through the aforementioned steps, a plurality of the solid-state imaging devices 1A with the structure of FIG. 19 is obtained simultaneously. With each of the devices 1A thus obtained, the edge section 60Ab of the glass cover 60A has the projecting part 60Ab1 shown in FIG. 19. Therefore, any other machining is unnecessary for forming the edge section 60Ab whose shape is like a frustum of a rectangular pyramid in the glass cover 60A; as a result, the increase in fabrication cost can be avoided.

If it is unnecessary that all the side faces of the solid-state imaging device 1 are covered with an insulating synthetic resin that forms a part of the CSP, the fabrication process sequence is completed at this stage. If it is necessary that all the side faces of the solid-state imaging device 1 are covered with an insulating synthetic resin that forms a part of the CSP, these side faces are covered with the insulating synthetic resin and thereafter, the fabrication process sequence is completed.

Example of Usage of Solid-State Imaging Device

The solid-state imaging device 1A with the structure of FIG. 19 is used as, for example, a camera module for a high image quality digital camera, as shown in FIG. 19. This camera module has the same structure as the first embodiment.

Rays L1, L2, and L3 of incoming light through the opening of the lens receiving member 91 propagate along the paths shown in FIG. 19. This is the same as the first embodiment. The ray L4 that has been incident on the edge section 60Ab of the glass cover 60 due to dimension errors during fabrication and/or placement errors during assembly is incident on the surface of the optical function film 63A at the projecting part 60Ab1 of the edge section 60Ab. If the optical function film 63A has an optical reflection function, the ray L4 is reflected outward from the central axis AX to reach the inner face of the lens receiving member 91 and absorbed by the optical absorption film (not shown) on the inner face of the member 91. Accordingly, the ray L4 generated by the aforementioned cause (a) will not degrade the image quality.

A part of external light that has reached the transmission section 60Aa of the glass cover 60A is reflected by the surface of the transition section 60Aa and then, the light thus reflected is further reflected toward the cover 60A by the collecting lens 90 to reach an outer area than the ray L4, generating rays of light that reach the outer area than the ray L4 (which correspond to the rays L5 and L6 in FIG. 3). These rays also are reflected outward from the central axis AX in the same way as that of the structure L4. Therefore, the rays generated by the aforementioned cause (b) will not degrade the image quality.

If the optical function film 63A has an optical absorption function, the rays of light that have reached the film 63 are absorbed by the film 63 itself; therefore, it is apparent that the ray L4 and the rays corresponding to the rays L5 and L6 in FIG. 3 will not degrade the image quality.

Similar to the ray La shown in FIG. 4, external light that has entered the inside of the glass cover 60A is reflected by the exit-side end face of the cover 60A or by the exit-side and the incidence-side end faces of the cover 60A and thereafter, is incident on the inner face of the optical function film 63A at the projecting part 60Ab1. As a result, when the film 63A has an optical reflection function, this light is reflected by the film 63A and sent to the outside of the imaging region 26. Therefore, the rays propagating in the cover 60A will not affect the image quality. When the film 63A has an optical absorption function, these rays are absorbed by the film 63A and therefore, they will not affect the image quality as well.

With the solid-state imaging device 1A according to the second embodiment of the present invention, as explained above, the image quality degradation due to the aforementioned causes (a) to (c) can be prevented with a simple structure. Similarly, with the camera module according to the first embodiment of the present invention also, the image quality degradation due to the aforementioned causes (a) to (c) can be prevented with a simple structure.

In the solid-state imaging device 1A according to the second embodiment also, an optical scattering region may be formed instead of the optical function film 63A.

Third Embodiment

FIG. 22 is a cross-sectional view showing the schematic structure of a solid-state imaging device 1B according to a third embodiment of the present invention. FIG. 23 is an enlarged partial view of an edge portion 60Bb of a glass cover 60B of the device 1B.

The solid-state imaging device 1B according to this embodiment is obtained by omitting the optical function film 63A in the aforementioned solid-state imaging device 1A according to the second embodiment and, instead of the film 63A, by forming an optical scattering region 63B on the surface of the edge section 60Bb1 of the glass cover 60B thereby scattering the light incident on the edge section 60Bb. The other structure is the same as the device 1A of the second embodiment and therefore, the explanation about the same structure is omitted here.

In the optical scattering region 63B, after the formation of the imaging device sections 65 having the same structure as shown in FIG. 21, a lot of minute lenses 62B are formed on the whole surface of the projecting part 60Bb1 of the edge section 60Bb of the cover 60B (on the outer side faces of the edge section 60Bb), as shown in FIG. 23, thereby forming minute projections and depressions on the same surface. Since the surface of the edge section 60Bb is made like frosted glass by doing so, light incident on the surface of the edge section 60Bb is scattered. As a result, a large part of this scattered light is absorbed by the optical absorption film on the lens receiving member 91. Some of the light thus scattered is returned to the edge section 60Bb due to reflection by the collecting lens 90; however, it has been attenuated sufficiently at this time and thus, the effect applied to the image quality is at a ignorable level.

This is applicable to light propagating in the glass cover 60B similarly. Specifically, light that has been incident on the inner face of the edge section 60Bb1 is scattered by the minute lenses 62B and attenuated. Therefore, this light does not affect the image quality.

The minute lenses 62B may be easily formed by known methods. For example, a resist film is formed on the surface of the edge section 60Bb and then, is patterned to be a lot of island-like parts. Thereafter, these island-like parts are heated and melted and as a result, these island-like parts will be lens-shaped due to surface tension. Each of the island-like parts thus lens-shaped will be the minute lens 62B.

In addition, instead of forming the minute lenses 62B, minute projections and depressions may be formed by colliding minute sands with the whole surface of the edge section 60Bb by a sandblasting method. This is because the edge section 60Bb whose surface is like frosted glass can be obtained by this method also.

With the solid-state imaging device 1B according to the third embodiment of the present invention, the image quality degradation due to the aforementioned causes (a) to (c) can be prevented with a simple structure. Similarly, with the camera module according to the third embodiment of the present invention using the device 1B also, the image quality degradation due to the aforementioned causes (a) to (c) can be prevented with a simple structure.

Instead of the optical scattering region 63B, the optical function film used in the aforementioned first or second embodiment may be formed.

Fourth Embodiment

FIG. 24 is a cross-sectional view showing the schematic structure of a solid-state imaging device 1C according to a fourth embodiment of the present invention. FIG. 25 is an enlarged partial view of an edge section 60Cb of a glass cover 60C of the device 1C.

With the solid-state imaging device 1C according to this embodiment, the edge section 60Cb of the cover 60C is removed by cutting obliquely with a flat plane, forming a tapered part 60Cb1. Moreover, an optical scattering region 63C is formed on the surface of the tapered part 60Cb1 in such a way that light incident on the edge section 60Cb is scattered. The other structure is the same as the device 1A of the second embodiment and therefore, the explanation about the same structure is omitted here.

The solid-state imaging device 1C can be fabricated by replacing the curved portion 83Ab of the dicing blade 83A used in the second embodiment with an inclined portion (not shown) having an oblique surface that forms the tapered part 60Cb1, and by performing the dicing process for the silicon wafer 70 using the dicing blade thus replaced along the scribe lines 71 established like a go board in the same way as the second embodiment. In addition, as disclosed in the Patent Literature 4, the tapered part 60Cb1 may be formed in advance with a blade having an oblique surface that forms the tapered part 60Cb1 and thereafter, the wafer 70 may be diced with a dicing blade having an ordinary profile.

In the optical scattering region 63C, a lot of minute projections and depressions 62C are formed on the whole surface of the tapered part 60Cb1 of the edge section 60Cb and the whole side faces thereof (the outer side faces of the edge section 60Cb), as shown in FIG. 25. Since the whole surface of the edge section 60Cb1 is made like frosted glass by such the structure, light incident on the surface of the edge section 60Cb1 is scattered. As a result, almost all of the light thus scattered is absorbed by the optical absorption film on the inner face of the lens receiving member 91. Some of the light thus scattered is returned to the edge section 60Cb due to reflection by the collecting lens 90; however, it has been attenuated sufficiently at this time and thus, the effect applied to the image quality is at a ignorable level.

This is applicable to light propagating in the glass cover 60C similarly. Specifically, light that has been incident on the inner face of the edge section 60Cb1 is scattered by the minute projections and depressions 62C and attenuated. Therefore, this light does not affect the image quality.

The minute projections and depressions 62C may be easily formed by, for example, the sandblasting method.

With the solid-state imaging device 1C according to the fourth embodiment of the present invention, the image quality degradation due to the aforementioned causes (a) to (c) can be prevented with a simple structure. Similarly, with the camera module according to the fourth embodiment of the present invention using the device 1C also, the image quality degradation due to the aforementioned causes (a) to (c) can be prevented with a simple structure.

It is sufficient that the minute projections and depressions 62C that form the scattering region 63C are formed on the surface of the tapered part 60Cb1 of the edge section 60Cb. The minute projections and depressions 62C formed on the side faces of the edge section 60Cb may be cancelled.

Instead of the scattering region 63C, the optical function film as used in the aforementioned first or second embodiment may be used.

First Variation of First Embodiment

FIG. 26 shows a first variation of the solid-state imaging device 1 according to the first embodiment of the present invention (see FIG. 1). The structure of this first variation is different from that of the device 1 of the first embodiment only in that the range covered by an optical function film 63-1 is narrower than that of the optical function film 63 of the device 1 of the first embodiment, and the other structure of this variation is the same as the device 1.

In the solid-state imaging device 1 of the first embodiment, the optical function film 63 covers entirely the projecting part 60b1, the transition part 60b3, and the depressed part 60b2 of the edge section 60b. On the other hand, in the first variation, the optical function film 63-1 covers only the projecting part 60b1 of the edge section 60b. For this reason, the optical scattering or absorption action is not applied to light irradiated to the transition part 60b3 and the depressed part 60b2 of the edge section 60b. However, the amount of the light irradiated to the transition and depressed parts 60b3 and 60b2 is small and thus, the effect by this light is weak. Accordingly, approximately the same advantage as that of the first embodiment is obtained in the first variation also.

Second Variation of First Embodiment

FIG. 27 shows a second variation of the solid-state imaging device 1 according to the first embodiment of the present invention (see FIG. 1). The structure of this second variation is different from that of the device 1 of the first embodiment only in that the range covered by an optical function film 63-2 is wider than that of the optical function film 63 of the device 1 of the first embodiment, and the other structure of this variation is the same as the device 1.

In the second variation, the optical function film 63-2 covers not only the projecting part 60b1, the transition part 60b3, and the depressed part 60b2 of the edge section 60b but also the side faces that have not been selectively removed of the edge section 60b (the side faces approximately parallel to the central axis AX). For this reason, the optical scattering or absorption action is given to light irradiated to the side faces of the edge section 60b approximately parallel to the central axis AX also. Accordingly, in addition to the same advantage as that of the first embodiment, an additional advantage that the danger of image quality degradation due to the light irradiated to the side faces of the edge section 60b approximately parallel to the central axis AX can be eliminated is obtained in the second variation.

Third Variation of First Embodiment

FIG. 28 shows a third variation of the solid-state imaging device 1 according to the first embodiment of the present invention (see FIG. 1). The structure of this third variation is different from that of the second variation only in that the range covered by an optical function film 63-3 is wider than that of the optical function film 63-2 of the second variation, and the other structure of this third variation is the same as the second variation.

In the third variation, the optical function film 63-3 covers not only the projecting part 60b1, the transition part 60b3, and the depressed part 60b2 of the edge section 60b but also the side faces that have not been selectively removed of the edge section 60b (the side faces approximately parallel to the central axis AX) and the side faces of the SOG material film 50. For this reason, the optical scattering or absorption action is given to the light irradiated to the side faces of the edge section 60b approximately parallel to the central axis AX and the side faces of the SOG material film 50 also. Accordingly, in addition to the same advantage as that of the first embodiment, an additional advantage that the danger of image quality degradation due to the light irradiated to the side faces of the edge section 60b approximately parallel to the central axis AX and the side faces of the SOG material film 50 can be eliminated is obtained in the third variation.

Fourth Variation of First Embodiment

FIG. 29 shows a fourth variation of the solid-state imaging device 1 according to the first embodiment of the present invention (see FIG. 1). The structure of this fourth variation is different from that of the third variation only in that the range covered by an optical function film 63-4 is wider than that of the optical function film 63-3 of the third variation, and the other structure of this fourth variation is the same as the third variation.

In the fourth variation, the optical function film 63-4 covers not only the projecting part 60b1, the transition part 60b3, and the depressed part 60b2 of the edge section 60b but also the side faces that have not been selectively removed of the edge section 60b (the side faces approximately parallel to the central axis AX), the side faces of the SOG material film 50, and the side faces of the silicon substrate 11. For this reason, the optical scattering or absorption action is given to the light irradiated to the side faces of the edge section 60b approximately parallel to the central axis AX, the side faces of the SOG material film 50, and the side faces of the silicon substrate 11 also. Accordingly, in addition to the same advantage as that of the first embodiment, an additional advantage that the danger of image quality degradation due to the light irradiated to the side faces of the edge section 60b approximately parallel to the central axis AX, the side faces of the SOG material film 50, and the side faces of the silicon substrate 11 can be eliminated is obtained in the third variation.

Fifth Variation of First Embodiment

FIG. 30 shows a fifth variation of the solid-state imaging device 1 according to the first embodiment of the present invention (see FIG. 1). The structure of this fifth variation is different from that of the fourth variation only in that the range covered by an optical function film 63-5 is wider than that of the optical function film 63-4 of the fourth variation, and the other structure of this fifth variation is the same as the fourth variation.

In the fifth variation, the optical function film 63-5 covers not only the projecting part 60b1, the transition part 60b3, and the depressed part 60b2 of the edge section 60b but also the side faces that have not been selectively removed of the edge section 60b (the side faces approximately parallel to the central axis AX), the side faces of the SOG material film 50, the side faces of the silicon substrate 11, and the peripheral area of the back of the substrate 11. For this reason, the optical scattering or absorption action is given to the light irradiated to the side faces of the edge section 60b approximately parallel to the central axis AX, the side faces of the SOG material film 50, the side faces of the silicon substrate 11, and the peripheral area of the back of the substrate 11 also. Accordingly, in addition to the same advantage as that of the first embodiment, an additional advantage that the danger of image quality degradation due to the light irradiated to the side faces of the edge section 60b approximately parallel to the central axis AX, the side faces of the SOG material film 50, the side faces of the silicon substrate 11, and the peripheral area of the back of the substrate 11 can be eliminated is obtained in the third variation.

Sixth Variation of First Embodiment

FIG. 31 shows a sixth variation of the solid-state imaging device 1 according to the first embodiment of the present invention (see FIG. 1). The structure of this sixth variation is different from that of the fifth variation only in that the range covered by an optical function film 63-6 is wider than that of the optical function film 63-5 of the fifth variation, and the other structure of this sixth variation is the same as the fifth variation.

In the sixth variation, the optical function film 63-6 covers not only the projecting part 60b1, the transition part 60b3, and the depressed part 60b2 of the edge section 60b but also the side faces that have not been selectively removed of the edge section 60b (the side faces approximately parallel to the central axis AX), the side faces of the SOG material film 50, and almost all of the back of the silicon substrate 11. For this reason, the optical scattering or absorption action is given to the light irradiated to the side faces of the edge section 60b approximately parallel to the central axis AX, the side faces of the SOG material film 50, the side faces of the substrate 11, and the back of the substrate 11 also. Accordingly, in addition to the same advantage as that of the first embodiment, an additional advantage that the danger of image quality degradation due to the light irradiated to the side faces of the edge section 60b approximately parallel to the central axis AX, the side faces of the SOG material film 50, the side faces of the silicon substrate 11, and the back of the substrate 11 can be eliminated is obtained in the third variation.

Fifth Embodiment

FIG. 32 is a cross-sectional view showing the schematic structure of a solid-state imaging device 1D according to a fifth embodiment of the present invention and a camera module using the device 1D. The collecting lens 90 and the lens receiving member 91 are omitted in FIG. 21.

With the solid-state imaging device 1D of this embodiment, different from the above-described first to fourth embodiments, an edge section 60Db of a glass cover 60D is not selectively removed, and the section 60Db is flat similar to the transmission section 60Da. Therefore, when this device 1D is fabricated, a dicing blade having curved surfaces like that shown in FIGS. 16 and 20 is unnecessary. A dicing blade having an ordinary profile may be used for this purpose.

In the edge section 60Db, the minute lenses 62B, which are the same as those used in the solid-state imaging device 1B according to the aforementioned third embodiment, are formed, thereby forming an optical scattering region 63D. Instead of forming the minute lenses 62B, similar minute projections and depressions may be formed by colliding minute sands with the whole surface of the edge section 60Db by a sandblasting method.

Since the surface of the edge section 60Db is made like frosted glass by doing so, light incident on the surface of the edge section 60Db is scattered. As a result, almost all the light thus scattered is absorbed by the optical absorption film on the inner face of the lens receiving member 91. Some of the light thus scattered may be returned to the edge section 60Db due to reflection on the collecting lens 90; however, it has been attenuated sufficiently at this time and thus, the effect applied to the image quality is at a ignorable level.

The same explanation as presented here is applied to light propagating in the glass cover 60D. Specifically, light incident on the inner face of the edge section 60Db is scattered and attenuated by the optical scattering region 63D. Thus, this light does not affect the image quality.

With the solid-state imaging device 1D according to the fifth embodiment of the present invention, the image quality degradation due to the aforementioned causes (a) to (c) can be prevented with a simple structure. Similarly, with the camera module according to the first embodiment of the present invention also, the image quality degradation due to the aforementioned causes (a) to (c) can be prevented with a simple structure.

Instead of the optical scattering region 63D, the optical function film used in the aforementioned first and second embodiments may be formed. In this case, however, it is preferred that this optical function film is designed to have an optical absorbing function in order to avoid optical reflection on the edge section 60Db.

Other Variations

Since the above-described first to fifth embodiments and first to sixth variations are exemplified examples of the present invention, it is needless to say that the present invention is not limited to these embodiments and variations, and any other modification is applicable to these embodiments and variations without departing the spirit of the present invention. For example, in the aforementioned embodiments, on the incidence side of the edge section of the transparent cover (glass cover), a projecting part whose surface is bent to project is formed to be adjacent to the border with the transition section, or a transition part and a depressed part are additionally formed continuously to this projecting part; however, the surface of the edge section of the transparent cover on its incidence side may have any other shape.

Moreover, the structure of the solid-state imaging element is optional. This element may have or may not have lenses (micro lenses) and/or color filters (micro filters).

INDUSTRIAL APPLICABILITY

The present invention is preferably applied to a solid-state imaging device having a solid-state imaging element mounted in a CSP. However, the invention is applicable to a solid-state imaging device having any other structure than this type if this solid-state imaging device has a solid-state imaging element and a transparent cover.

The invention claimed is:

1. A solid-state imaging device comprising:
   (a) a solid-state imaging element having an imaging region; and
   (b) a transparent cover covering a whole surface of the imaging region, wherein the cover comprises
      i. a transmission section corresponding to the imaging region of the imaging element; and
      ii. an edge section that surrounds the transmission section outside the transmission section, wherein the edge section of the cover comprises a frustum-shaped part whose cross-sectional area decreases continuously from an exit side to an incidence side in the cover around a periphery of the edge section, and a curved, projecting part formed at a position adjacent to a border with the transmission section on the incidence side of the frustum-shaped part of the edge section, and a curved, depressed part formed to be continuous to the projecting part by way of a transition part; and
   (c) an optical function region having an optical absorption, reflection, or scattering action, wherein the optical function region is formed on an outer face of the frustum-shaped part of the cover.

2. The device according to claim 1, wherein the projecting part is provided around the whole edge section.

3. The device according to claim 1, wherein the optical function region is formed by an optical function film formed on the outer face of the frustum-shaped part.

4. The device according to claim 1, wherein the optical function region is formed on the outer face of the frustum-shaped part by processing the same outer face.

5. A solid-state imaging device comprising:
   (a) a solid-state imaging element having an imaging region; and
   (b) a transparent cover covering a whole surface of the imaging region, wherein the cover comprises
      i. a transmission section corresponding to the imaging region of the imaging element; and
      ii. an edge section that surrounds the transmission section outside the transmission section, wherein the edge section of the cover comprises a curved, projecting part formed at a position adjacent to a border with the transmission section on an incidence side of a frustum-shaped part of the edge section, and a curved, depressed part formed to be continuous to the projecting part by way of a transition part; and
   (c) an optical scattering region is formed on the edge section of the cover, wherein the optical scattering region is realized by minute lenses formed on a surface of the edge section.

6. A camera module comprising:
   the solid-state imaging device according to claim 1; and
   an imaging optical system that irradiates external light to the imaging region of the imaging element by way of the transmission section of the cover of the imaging device.

7. A camera module comprising:
   the solid-state imaging device according to claim 6; and
   an imaging optical system that irradiates external light to the imaging region of the imaging element by way of the transmission section of the cover of the imaging device.

8. A camera module comprising:
   the solid-state imaging device according to claim 3; and
   an imaging optical system that irradiates external light to the imaging region of the imaging element by way of the transmission section of the cover of the imaging device.

9. A camera module comprising:
   the solid-state imaging device according to claim 4; and
   an imaging optical system that irradiates external light to the imaging region of the imaging element by way of the transmission section of the cover of the imaging device.

10. A camera module comprising:
    the solid-state imaging device according to claim 5; and
    an imaging optical system that irradiates external light to the imaging region of the imaging element by way of the transmission section of the cover of the imaging device.

11. The device according to claim 1, further comprising:
    (d) a substrate, wherein the solid-state imaging element is formed on or over a surface of the substrate; and
    (e) a penetrating electrode that effects an electrical interconnection through the substrate between the solid-state imaging element and an external electrode formed on a back of the substrate.

12. The device according to claim 3, wherein the optical function film is in close contact with the outer surface of the edge section.

13. The device according to claim 1, wherein the optical function region has an optical reflection action, and the optical function region is formed by a metal film.

14. The device according to claim 1, wherein the optical function region has an optical absorption action, and the optical function region is formed by a coated film of an epoxy resin into which carbon powder has been dispersed.

15. The device according to claim 3, wherein the optical function film covers the whole outer face of the frustum-shaped part.

16. The device according to claim 11, wherein the optical function film covers the whole outer face of the frustum-shaped part and a whole side face of the substrate.

17. The device according to claim 11, wherein the optical function film covers the whole outer face of the frustum-shaped part, a whole side face of the substrate, and a whole side face of a member or part intervening between the optical function film and the substrate.

18. A solid-state imaging device comprising:
(a) a solid-state imaging element having an imaging region;
(b) a transparent cover covering a whole surface of the imaging region, wherein the cover comprises
  i. a transmission section corresponding to the imaging region of the imaging element; and
  ii. an edge section that surrounds the transmission section outside the transmission section, wherein the edge section of the cover comprises a frustum-shaped part whose cross-sectional area decreases continuously from an exit side to an incidence side in the cover around a periphery of the edge section;
(c) an optical function region having an optical absorption, reflection, or scattering action is formed on an outer face of the frustum-shaped part, and the solid-state imaging element is formed on or over a surface of a substrate; and
(d) a penetrating electrode that effects an electrical interconnection through the substrate between the solid-state imaging element and an external electrode formed on a back of the substrate.

19. A solid-state imaging device comprising:
(a) a solid-state imaging element having an imaging region;
(b) a transparent cover covering a whole surface of the imaging region, wherein the cover comprises
  i. a transmission section corresponding to the imaging region of the imaging element; and
  ii. an edge section that surrounds the transmission section outside the transmission section, wherein the edge section of the cover comprises a curved, projecting part formed at a position adjacent to a border with the transmission section on an incidence side of a frustum-shaped part of the edge section, and a curved, depressed part formed to be continuous to the projecting part by way of a transition part;
(c) an optical scattering region is formed on an the edge of the cover, and the solid-state imaging element is formed on or over a surface of a substrate; and
(d) a penetrating electrode that effects an electrical interconnection through the substrate between the solid-state imaging element and an external electrode formed on a back of the substrate.

20. A camera module comprising:
the solid-state imaging device according to claim 11; and
an imaging optical system that irradiates external light to the imaging region of the imaging element by way of the transmission section of the cover of the imaging device.

21. A camera module comprising:
the solid-state imaging device according to claim 12; and
an imaging optical system that irradiates external light to the imaging region of the imaging element by way of the transmission section of the cover of the imaging device.

22. A camera module comprising:
the solid-state imaging device according to claim 13; and
an imaging optical system that irradiates external light to the imaging region of the imaging element by way of the transmission section of the cover of the imaging device.

23. A camera module comprising:
the solid-state imaging device according to claim 14; and
an imaging optical system that irradiates external light to the imaging region of the imaging element by way of the transmission section of the cover of the imaging device.

24. A camera module comprising:
the solid-state imaging device according to claim 15; and
an imaging optical system that irradiates external light to the imaging region of the imaging element by way of the transmission section of the cover of the imaging device.

25. A camera module comprising:
the solid-state imaging device according to claim 16; and
an imaging optical system that irradiates external light to the imaging region of the imaging element by way of the transmission section of the cover of the imaging device.

26. A camera module comprising:
the solid-state imaging device according to claim 17; and
an imaging optical system that irradiates external light to the imaging region of the imaging element by way of the transmission section of the cover of the imaging device.

27. A camera module comprising:
the solid-state imaging device according to claim 18; and
an imaging optical system that irradiates external light to the imaging region of the imaging element by way of the transmission section of the cover of the imaging device.

28. A camera module comprising:
the solid-state imaging device according to claim 19; and
an imaging optical system that irradiates external light to the imaging region of the imaging element by way of the transmission section of the cover of the imaging device.

* * * * *